United States Patent [19]

Nagasaki et al.

[11] Patent Number: 5,060,191

[45] Date of Patent: Oct. 22, 1991

[54] FERROELECTRIC MEMORY

[75] Inventors: Tatsuo Nagasaki, Yokohama; Masayoshi Omura, Tachikawa; Hitoshi Watanabe; Shinichi Imade, both of Hachiooji; Eishi Ikuta, Sagamihara; Hiroyuki Yoshimori, Fujino; Kazuhisa Yanagisawa, Mitaka, all of Japan

[73] Assignee: Olympus Optical Co., Ltd., Tokyo, Japan

[21] Appl. No.: 373,082

[22] Filed: Jun. 28, 1989

[30] Foreign Application Priority Data

Jul. 8, 1988 [JP] Japan ................................. 63-170471
Dec. 20, 1988 [JP] Japan ................................. 63-321639

[51] Int. Cl.$^5$ ............................................ G11C 11/22
[52] U.S. Cl. ..................................... 365/145; 365/117; 365/109
[58] Field of Search ................ 365/117, 145, 109, 112

[56] References Cited

U.S. PATENT DOCUMENTS

| 3,681,765 | 8/1972 | Chapman | 365/109 |
| 3,871,745 | 3/1975 | Waku et al. | 365/117 |
| 4,860,254 | 8/1989 | Pott et al. | 365/145 |
| 4,873,455 | 10/1989 | de Chambost et al. | 365/117 X |

FOREIGN PATENT DOCUMENTS

| 0166938 | 5/1985 | European Pat. Off. |  |
| 3439283A1 | 10/1984 | Fed. Rep. of Germany |  |
| 3602887A1 | 1/1986 | Fed. Rep. of Germany |  |
| 2142494 | 1/1985 | United Kingdom | 365/117 |

OTHER PUBLICATIONS

Japanese Journal of Applied Physics, vol. 14, No. 11, pp. 1845-1846, Nov. 1975.

Primary Examiner—Joseph A. Popek
Attorney, Agent, or Firm—Frishauf, Holtz, Goodman & Woodward

[57] ABSTRACT

A ferroelectric memory includes a ferroelectric thin film having first and second surfaces opposite to each other, a first electrode assembly having a plurality of stripe electrodes arranged in parallel on the first surface side of the ferroelectric thin film, a second electrode assembly having a plurality of stripe electrodes arranged in parallel on the second surface side of the ferroelectric thin film to intersect the stripe electrodes of said first electrode assembly, first and second common electrodes arranged separately from the end portions of the respective first and second electrode assemblies to extend in respective directions in which the stripe electrodes of the first and second electrode assemblies are arranged, and selecting sections for respectively connecting the first and second electrode assemblies to the first and second common electrodes and selectively activating at least one of the stripe electrodes of each of the first and second electrode assemblies.

19 Claims, 30 Drawing Sheets

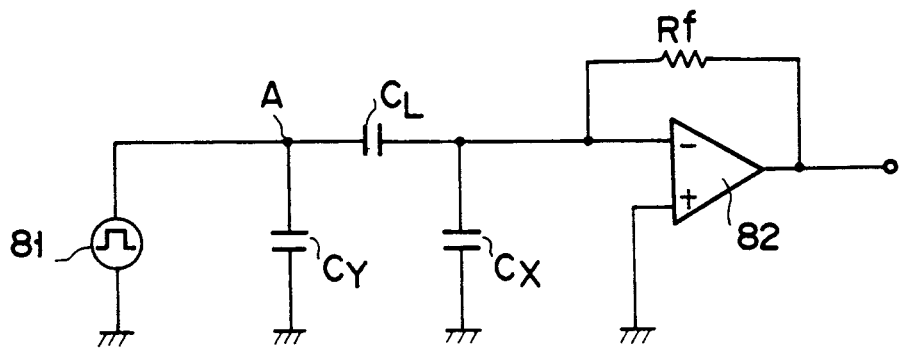
F I G. 16
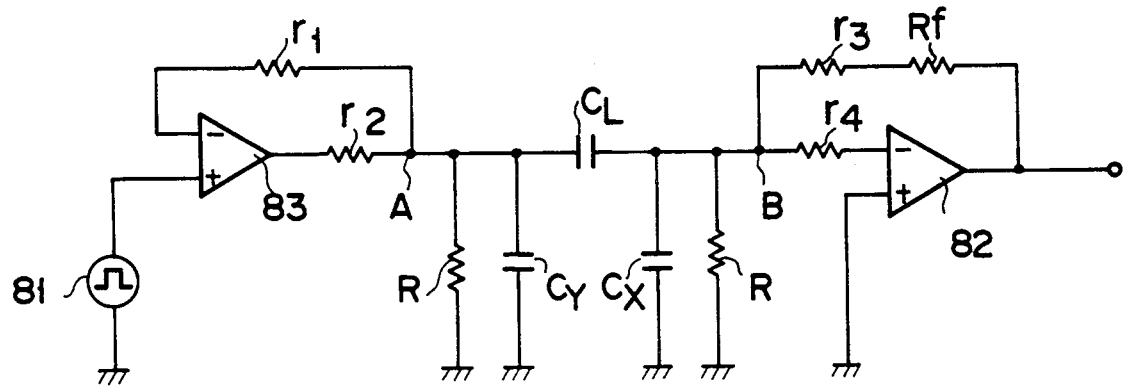
F I G. 18

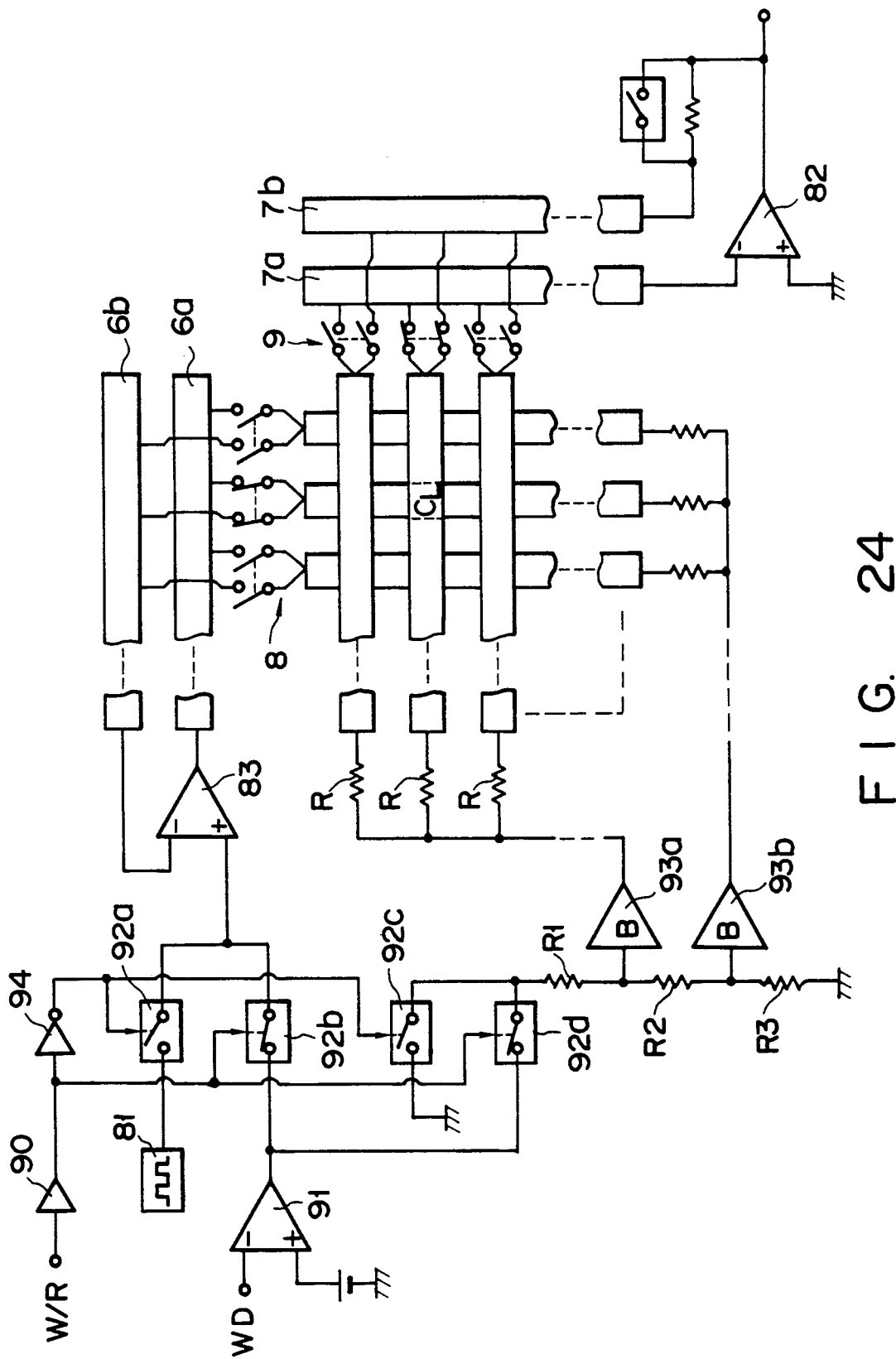
F I G. 24

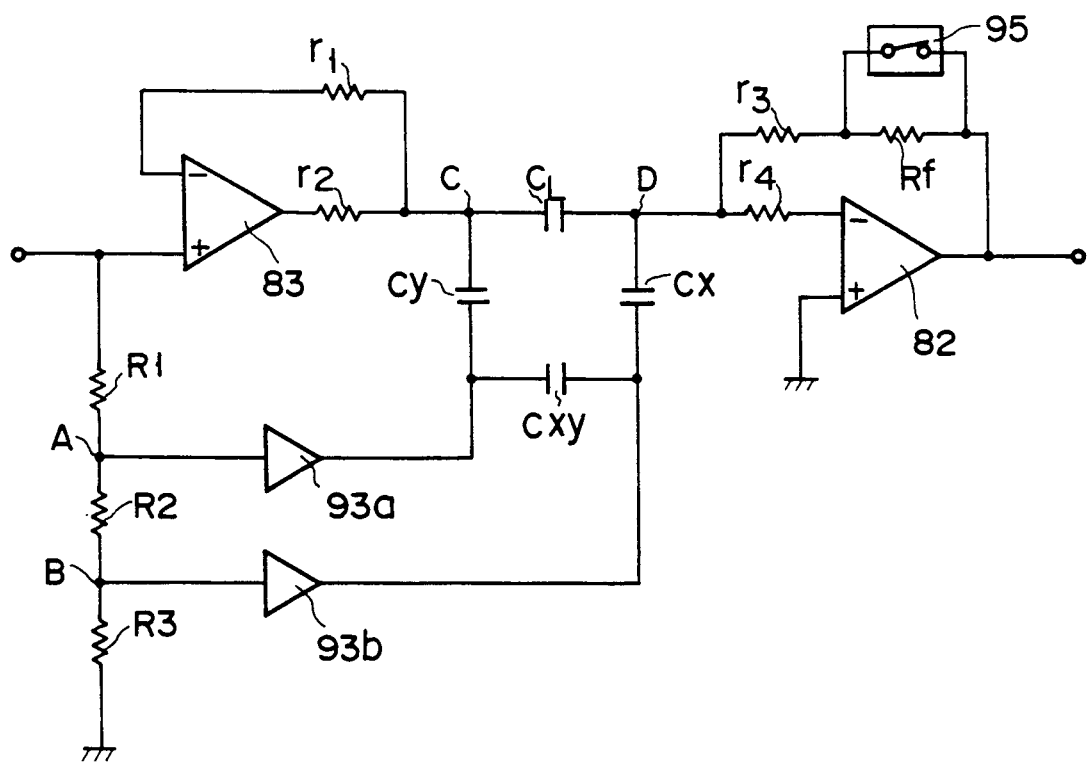
F I G. 26

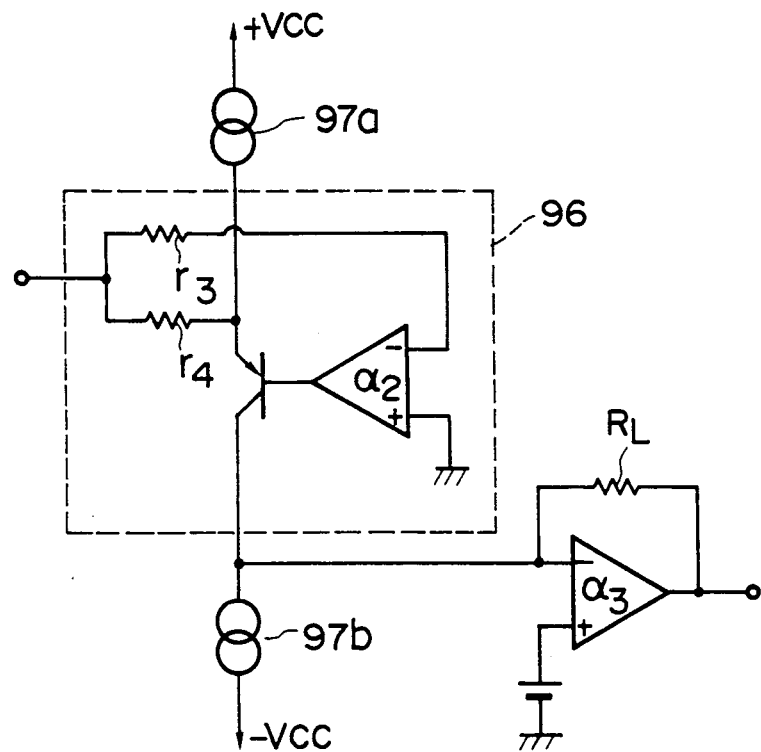
F I G. 27
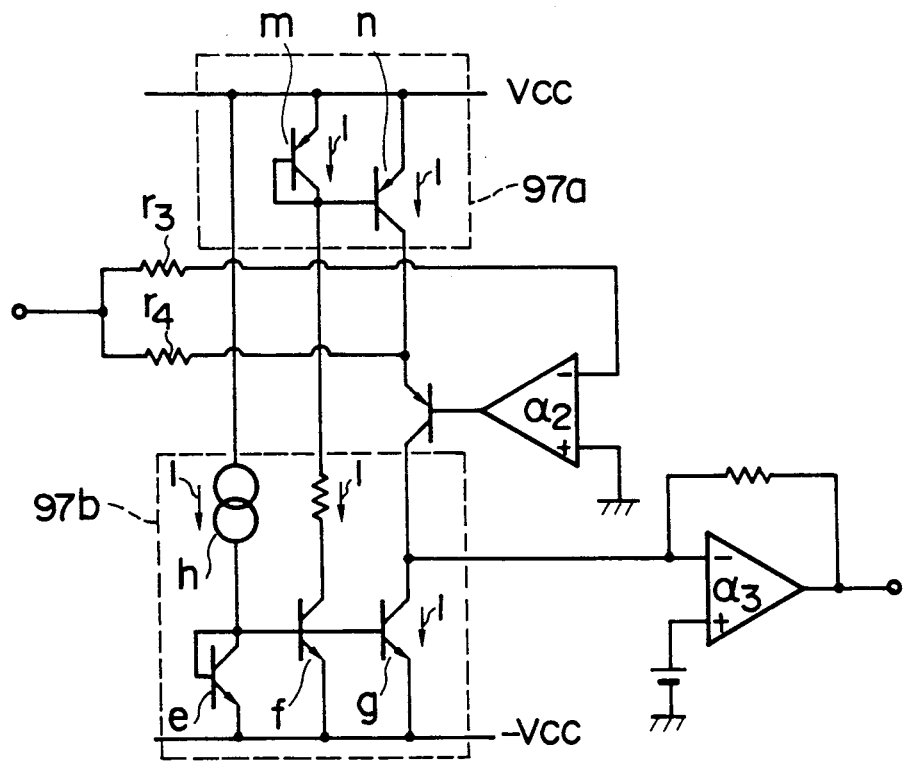
F I G. 28

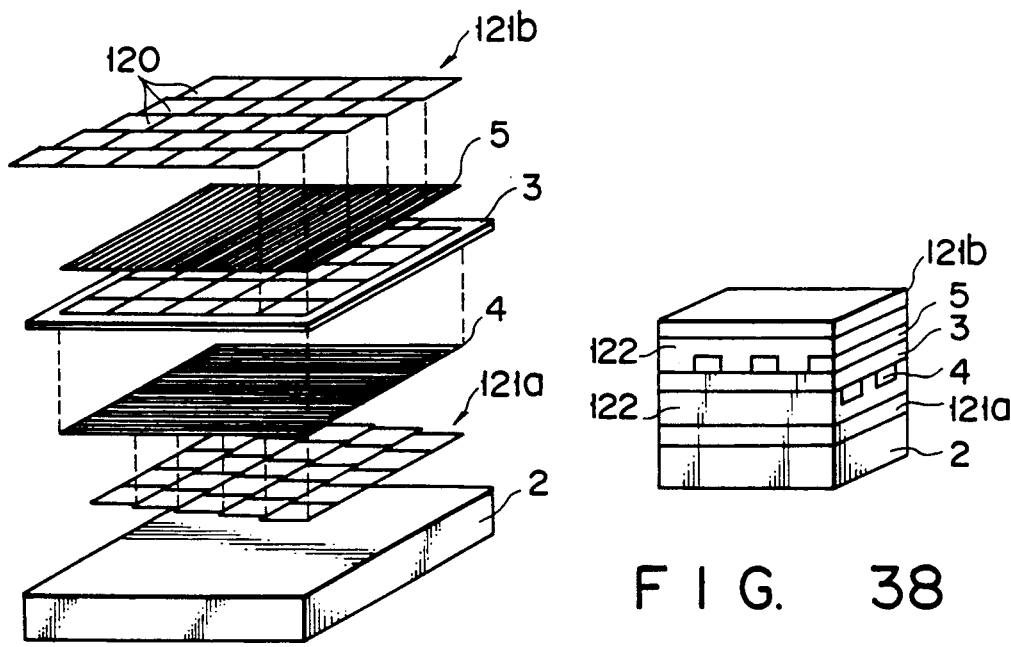
FIG. 36
FIG. 38
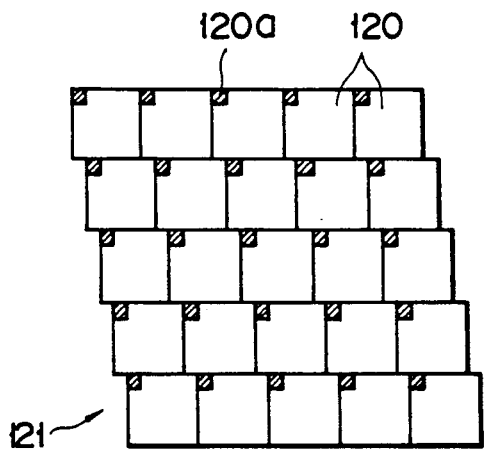
FIG. 37
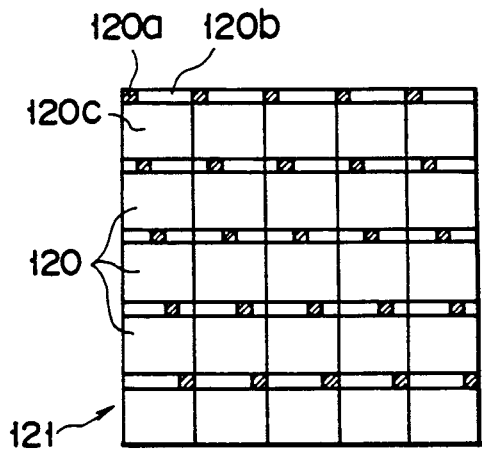
FIG. 39

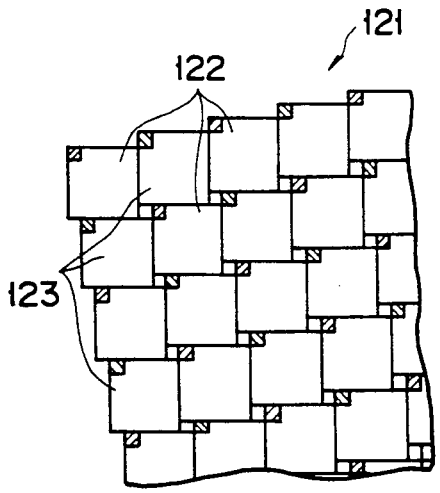
F I G. 41
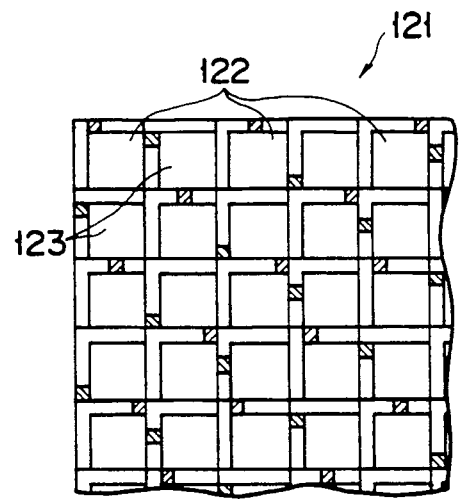
F I G. 42
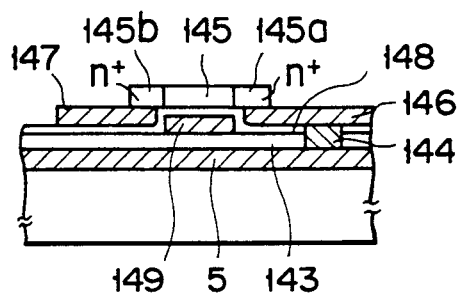
F I G. 43A
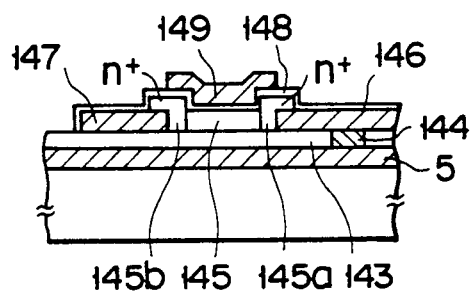
F I G. 43B
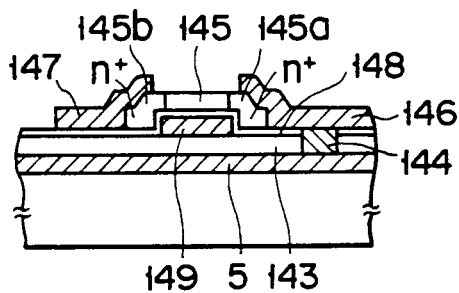
F I G. 43C

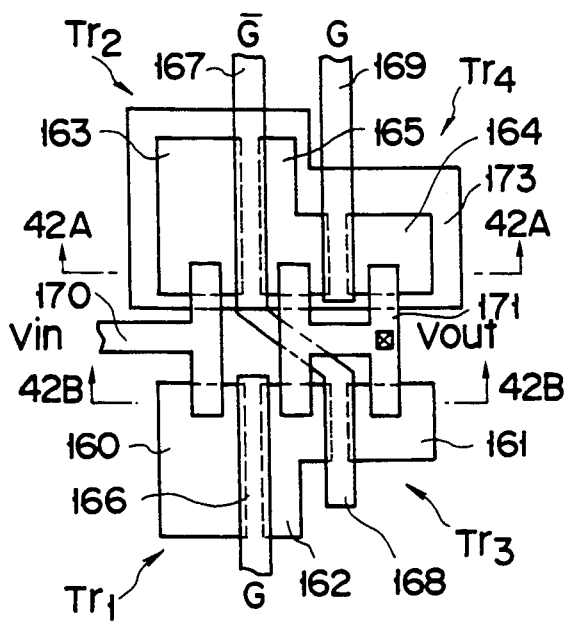
FIG. 48
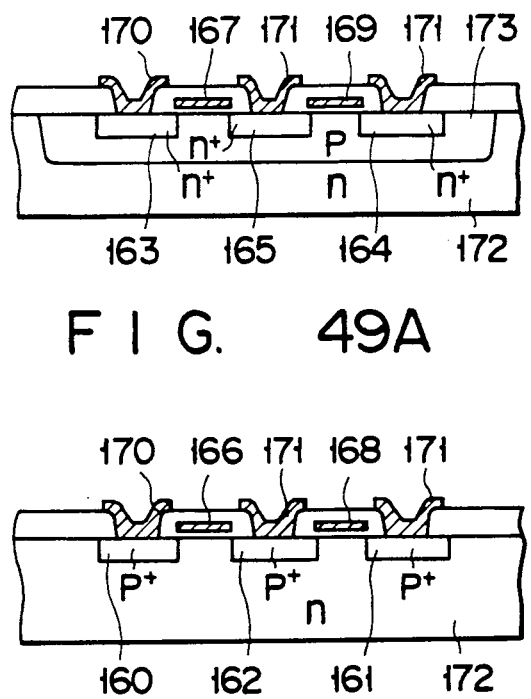
FIG. 49A
FIG. 49B
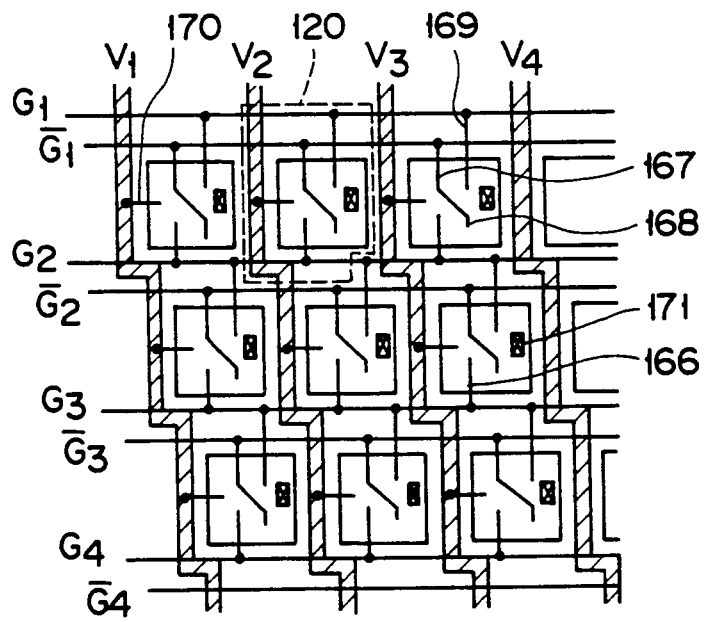
FIG. 50

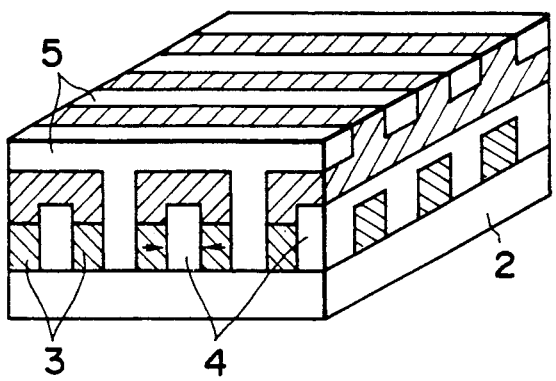
F I G. 54A
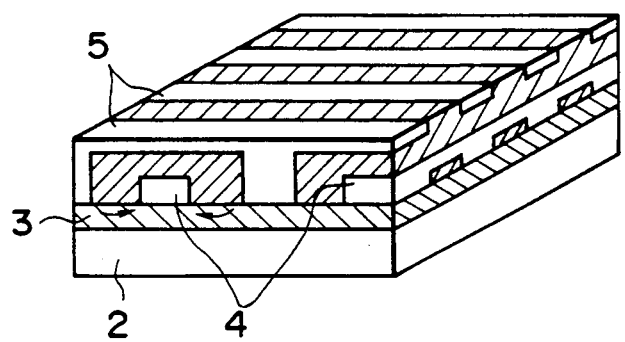
F I G. 54B
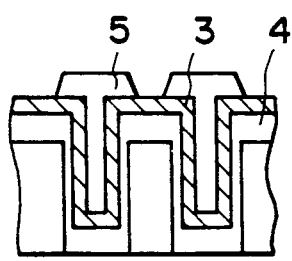
F I G. 55

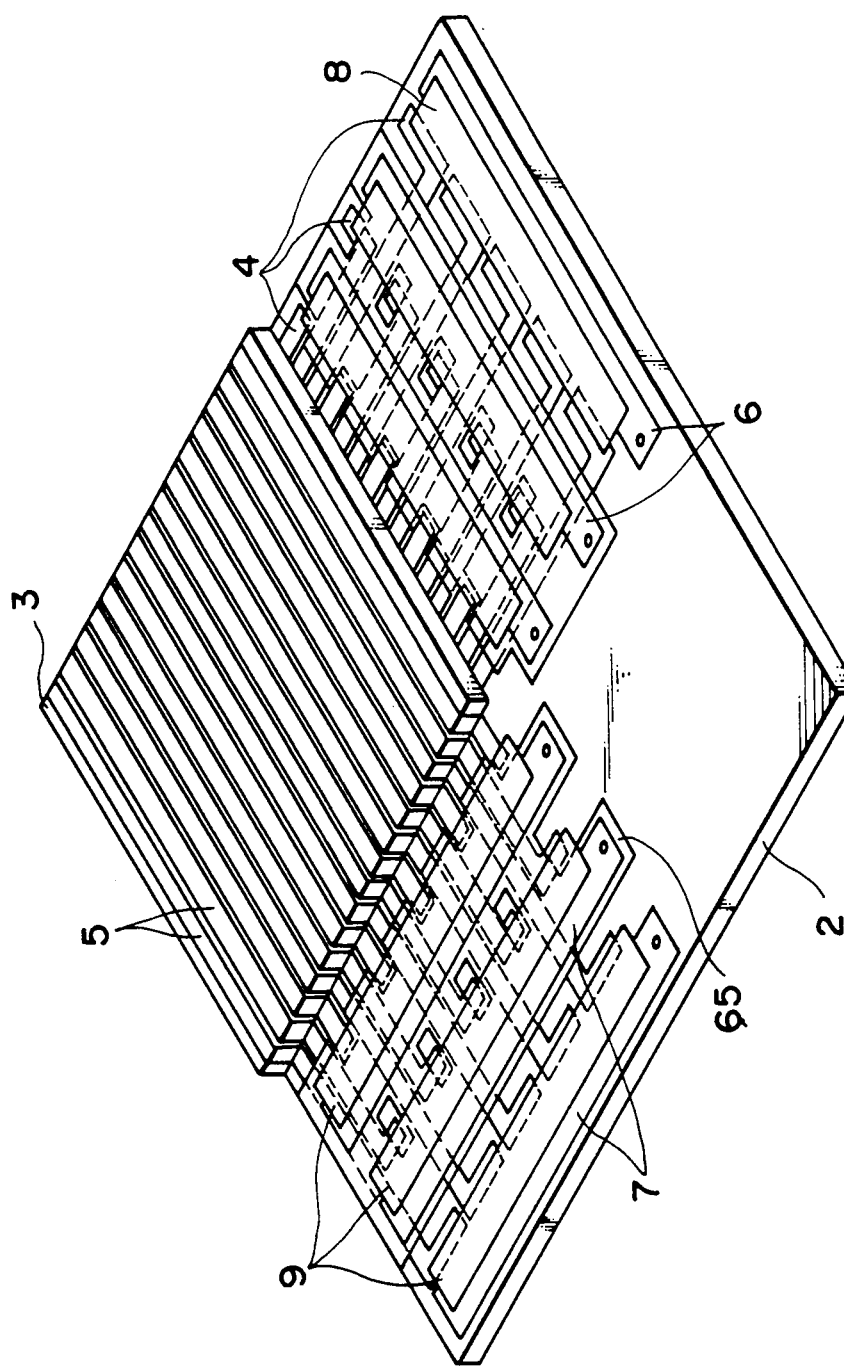
F I G. 56

FERROELECTRIC MEMORY

BACKGROUND OF THE INVENTION

1. Field of the Invention

This invention relates to a ferroelectric memory using ferroelectric material as information storing medium (memory) and methods for driving and manufacturing the same.

2. Description of the Related Art

It is generally known that ferroelectric material has a hysteresis characteristic and data can be stored by utilizing the hysteresis characteristic. FIG. 58 shows the hysteresis characteristic, in which the abscissa indicates electric field strength E and the ordinate indicates polarization intensity P. In the drawing, Ec denotes an electric field causing a polarization direction to be inverted, or electric field (referred to as a coercive electric field) occurring when the polarization value is set at "0", and Es denotes an electric field (referred to as an inverted electric field) causing the direction of the hysteresis loop to be inverted. As shown in FIG. 58, when the electric field strength is 0, the polarization is set into one of two states A and C which are respectively set to correspond to digital signals "1" and "0". That is, when the polarization is set in state A, digital signal "1" is stored, and when the polarization is in state B, digital signal "0" is stored.

Assume that signal "1" is stored in the ferroelectric material and the polarization is in state A. If, in this condition, positive going readout pulse Ec is applied to the ferroelectric material, the polarization state is changed from A to B, and is set back to A again. At this time, variation in the polarization intensity for the variation amount of Er is small so that variation in capacitance $C_L$ associated with the ferroelectric material may be small. In contrast, when signal "0" is stored in the ferroelectric material and the polarization is in state B and if positive going readout pulse Ec is applied, the polarization state is changed from C to D, and is set back to C again. Since, at this time, variation in the polarization intensity between polarization states C and D is large, causing variation in capacitance $C_L$ to be large. In this way, when signal "1" is stored, the capacitance variation is small and a small output is derived, and when signal "0" is stored, the capacitance variation is large and a large output is derived. Thus, the "1" and "0" states can be determined according to the output and as a result data can be read out.

As is seen from FIG. 58, a recording pulse of voltage level Es may be applied in order to change the polarization state of the ferroelectric material from "0" to "1", and a pulse of voltage level −Es may be applied in order to change the polarization state from "1" to "0".

The prior art technique of using the ferroelectric material as information recording medium by utilizing the hysteresis characteristic of the ferroelectric material is disclosed in, for example, Japanese Patent Disclosure Nos. 55-126905, 57-117186, 59-215096 and 59-215097. Another method of recording and reading out information with respect to the ferroelectric material is disclosed in, for example, Japanese Patent Disclosure No. 59-215096. That is, as shown in FIG. 59, photoconductive film or ferroelectric thin film 74 is arranged between transparent electrode 73 which is disposed on substrate 72 and transparent electrode 75 to constitute ferroelectric memory 71. With a voltage kept applied to ferroelectric memory 71, a light beam is applied to a selected portion of the photoconductive film to polarize the selected portion so as to record information. In the readout mode, the information can be read out by applying a light beam to the selected portion by utilizing variation in the refraction, interference and polarization of light due to the polarization of the selected portion.

In the above conventional example, a light beam is applied to the surface of the ferroelectric memory and controlled to sequentially record or read out information by directly applying a light beam to the surface of the photoconductive film of the ferroelectric memory. In this case, the information storing position is not specified on the ferroelectric memory and the storing position is determined by mechanically controlling the position of application of the light beam. For this reason, it is necessary to precisely control the position of application of the light beam so as not be erroneously record information on or read out information from a next storing section because of deviation of the light beam or the like. As the storing density is made higher, the position control must be effected more precisely. Therefore, the construction becomes more complicated. Further, since information can be recorded only in a two-dimensional area, it is difficult to increase the storing capacity by laminating the ferroelectric memories.

SUMMARY OF THE INVENTION

An object of this invention is to provide a small and thin ferroelectric memory and methods for driving and manufacturing the same in which the information storing position of a ferroelectric memory can be specified to simplify the position controlling for the storing and reading operations and information can be stored and read out at a high speed.

Another object of this invention is to provide a laminated type ferroelectric memory and methods for driving and manufacturing the laminated type ferroelectric memory which is formed by laminating a plurality of ferroelectric memories to have a large capacity and in which information can be stored and read out.

A still another object of this invention is to provide a ferroelectric memory and methods for driving and manufacturing the same in which the crosstalk between adjacent storing positions can be suppressed to enhance the S/N ratio, thus permitting information to be stored and read out in the selected storing position with high reliability.

Further, an object of this invention is to provide a novel memory card formed with a ferroelectric memory and having a significantly enlarged memory capacity.

The above object or objects can be attained by a ferroelectric memory which comprises a ferroelectric thin film having first and second surfaces opposite to each other; a first electrode assembly having a plurality of stripe electrodes arranged in parallel on the first surface side of the ferroelectric thin film; a second electrode assembly having a plurality of stripe electrodes arranged in parallel on the second surface side of the ferroelectric thin film to intersect the stripe electrodes of the first electrode assembly; first and second common electrodes arranged separately from the end portion of the respective first and second electrode assemblies to extend in respective directions in which the stripe electrodes of the first and second electrode assemblies are arranged; and selection means for respectively connecting the first and second electrode assemblies to the first and second common electrodes and selectively activating at least one of the stripe electrodes of each of the first and second electrode assemblies.

For example, the selection means includes a photoconductive film, and a light beam is applied to the photoconductive film to select a memory cell so that a voltage can be applied between the first and second electrode assemblies, thus permitting data to be stored into or read out from the selected memory cell.

At least two selector means which are provided in parallel for each of the stripe electrodes of the first and second electrode assemblies may be used as the above selection means and control means is used to control the selector means and cause the non-selected stripe electrodes to be grounded.

Further, the ferroelectric memory can be disposed inside a card to form a ferroelectric memory card.

According to the ferroelectric memory described above, data can be stored by residual polarization effect, the storing position of data can be specified and data can be stored and read out with high reliability and high speed.

BRIEF DESCRIPTION OF THE DRAWINGS

FIGS. 15 to 28 show ferroelectric memories according to still other embodiments of this invention in which a countermeasure is taken to prevent the crosstalk, FIG. 15 showing a ferroelectric memory according to one embodiment of this invention having means for preventing the crosstalk, FIG. 16 being an equivalent circuit of the ferroelectric memory of FIG. 15, FIG. 17 showing a ferroelectric memory according to another embodiment of this invention having means for preventing the crosstalk, FIG. 18 being an equivalent circuit of the ferroelectric memory of FIG. 17, FIGS. 19 to 23 showing the detail construction of selection means used in the above embodiments, FIGS. 24 to 26 showing an embodiment for preventing the crosstalk in the writing mode, and FIGS. 27 and 28 being circuit diagrams of an output amplifier used in the above embodiments;

FIGS. 29 to 35 show other embodiment of this invention, in which FIG. 29 shows the hysteresis characteristic of a ferroelectric material, FIG. 30 is a view showing a ferroelectric memory using a group of silicon symmetrical switch, FIG. 31 is a view showing the silicon symmetrical switch, FIG. 32 shows a characteristic curve of the silicon symmetrical switch, FIG. 34 is a view showing the memory of further embodiment, and FIG. 35 is a view showing a voltage-current characteristic curve of the memory shown in FIG. 34;

FIGS. 36 to 53 show other embodiments of this invention using a drive cell layer, FIG. 36 being an exploded perspective view showing a ferroelectric memory according to one embodiment of this invention using the drive cell layer, FIG. 37 showing an example of the drive cell layer, FIG. 38 being a partial cross section of the ferroelectric memory, FIG. 39 showing another example of the drive cell layer, FIGS. 40A to 40O showing an example of the process of manufacturing the ferroelectric memory having the drive cell layer, FIGS. 41 and 42 showing drive cell layers used for two electrode assemblies, FIGS. 43A to 43C respectively showing a reverse planar thin film transistor (TFT), stagger TFT and reverse stagger TFT, FIGS. 44 to 47 showing drive cell layers obtained when a semiconductor switch is formed of a MOS transistor, FIGS. 48 to 50 showing drive cell layers obtained when a semiconductor switch is formed of a CMOS transistor shown in FIG. 23, FIG. 51 showing a laminated type ferroelectric memory having the drive cell layer, and FIGS. 52 and 53 showing another process of manufacturing the ferroelectric memory having the drive cell layer;

FIGS. 54A and 54B are views showing a ferroelectric memory in which the polarization direction is set to be perpendicular to a lamination direction;

FIG. 55 shows an embodiment in which the effective area of the two electrodes of a memory cell facing each other is increased;

FIG. 56 shows another embodiment in which a plurality of common electrodes are used as the common electrode in the ferroelectric memory shown in FIG. 1;

DETAILED DESCRIPTION OF THE PREFERRED EMBODIMENTS

There will now be described embodiments of this invention.

Figure 1:
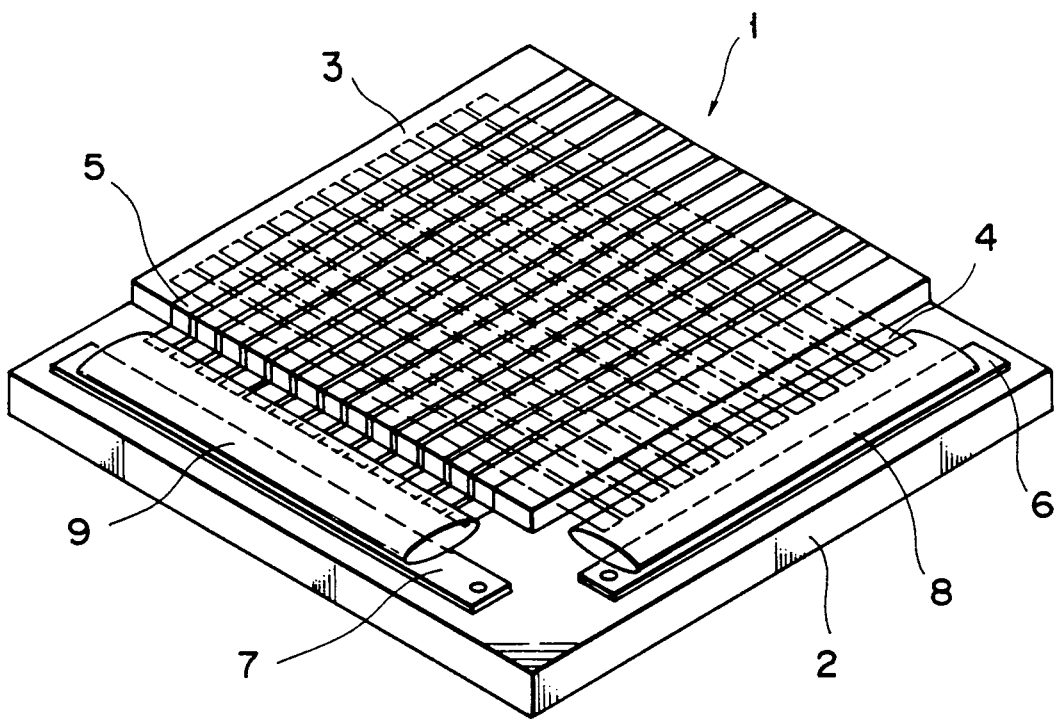
FIG. 1 is a schematic view for illustration of one embodiment of this invention.

FIG. 1 shows a ferroelectric memory according to one embodiment of this invention. As shown in FIG. 1, ferroelectric memory 1 includes ferroelectric thin film 3 of 0.3 $\mu$m thickness formed on the surface of an insulative substrate having a thickness of 200 $\mu$m for attaining sufficiently high mechanical strength. The material of substrate 2 may be selected from glass, ceramics, metal, polymeric material, semiconductor material or the like according to the application thereof, and inorganic material such as lead zirconate titanate (PZT) or barium titanate (BaTiO$_3$) or KNO$_3$, or polymeric material such as vynilidene fluoride series copolymer may be used as the material of ferroelectric thin film 3. First electrode assembly 4 which has a plurality of stripe electrodes arranged in parallel at a regular interval to extend in one direction (X direction) is disposed between substrate 2 and ferroelectric thin film 3. Further, second electrode assembly 5 which has a plurality of stripe electrodes arranged to extend in a direction (Y direction) perpendicular to the array direction of the stripe electrodes of first electrode assembly 4 is disposed on the opposite (upper) surface of ferroelectric thin film 3. First and second electrode assemblies 4 and 5 are each formed of Al, TiW, Mo, Ta or the like. The thickness of each stripe electrode is 0.1 μm, the width thereof is 0.5 μm, and the interval between adjacent stripe electrodes is 0.5 μm. Common electrodes 6 and 7 are disposed on those portions of substrate 2 which are separated from first and second electrode assemblies 4 and 5, and are arranged to extend in the respective array directions of the stripe electrodes of first and second electrode assemblies 4 and 5 as shown in FIG. 1. Further, photoconductive members 8 and 9 are formed on and between respective common electrodes 6 and 7 and respective electrode assemblies 4 and 5 as selection means for selectively connecting common electrodes 6, 7 to the ends of the stripe electrodes of first and second electrode assemblies 4, 5. Amorphous silicon, crystal silicon, polyvinyl carvazole (PVK) or the like is used as the material of photoconductive members 8 and 9 in consideration of the response time and resistance.

Next, the method of manufacturing ferroelectric memory 1 with reference to FIGS. 2A to 2I.

First, the material of substrate 2 is selected according to the ferroelectric material used. That is, when the ferroelectric thin film is formed of inorganic material such as PZT or BaTiO$_3$, it may be necessary to effect the high temperature firing process in order to control the crystal orientation, and organic polymeric material is not suitable for the material of substrate 2. In this case, it is preferable to use wafers of amorphous silicon, single crystal silicon, sapphire single crystal or the like, or other inorganic heat resistant wafers as substrate 2. In a case where vynilidene fluoride series copolymer or vynilidine cyanide series copolymer is used to form the ferroelectric thin film, it is possible to effect the coating film formation and low-temperature drying process and therefore thermoplastic material may also be used to form substrate 2.

Since at least the surface portion of substrate 2 must be insulative, it is necessary to oxidize the surface portion of an electrically conductive substrate such as a metal substrate or form a thin insulative film of SiO$_2$, Al$_2$O$_3$ or the like on the surface thereof.

Figure 2A:
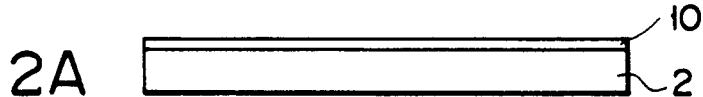
FIGS. 2A to 2I show the process of manufacturing the ferroelectric memory shown in FIG. 1.
Figure 2B:
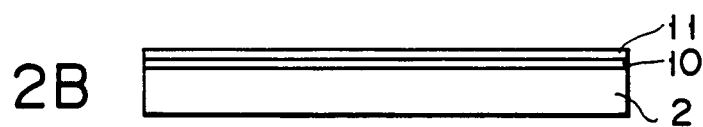

First, as shown in FIG. 2A, electrically conductive metal material such as Au, Pt, Ag, or Al, or transparent conductive material such as ITO is deposited by the sputtering method or vacuum deposition method as is well known in the art to form conductive film 10. Then, as shown in FIG. 2B, resist 11 is coated on the surface of conductive film 10 to form a resist film by the spin coating technique.

Figure 2C:
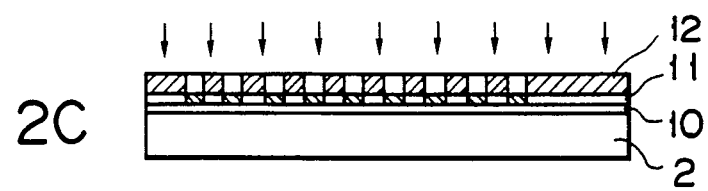

After this, as shown in FIG. 2C, an ultraviolet ray or electron beam is applied via mask 12 which is patterned correspondingly to first electrode assembly 4 and common electrode 6 so as to print the resist film Resist film 11 may be used in the form of positive or negative pattern according to the memory construction or pattern shape.

Figure 2D:
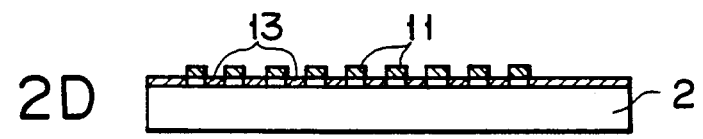

After the pattern development, the mask is removed and the non-exposed portion of the resist film is removed as shown in FIG. 2D.

Figure 2E:
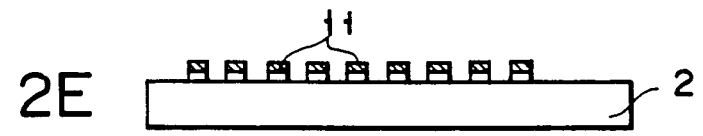

Then, as shown in FIG. 2E, portion of conductive layer 10 which is not required for forming first electrode assembly 4, common electrode 6 and the like is etched out.

Figure 2F:
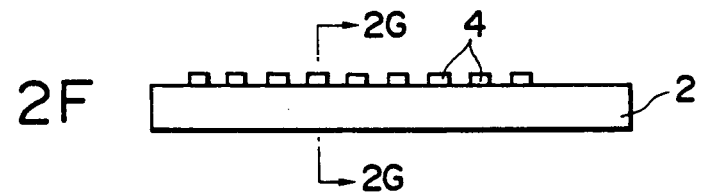
Figure 2G:
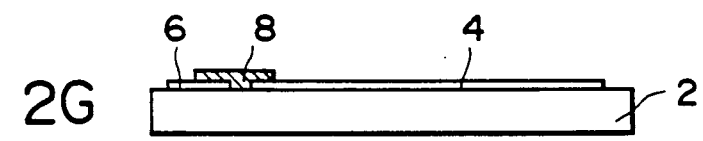

After this, as shown in FIGS. 2F and 2G, resist film 11 is removed, and thus first electrode assembly 4 having a plurality of first stripe electrodes and common electrode 6 are formed.

Figure 2H:
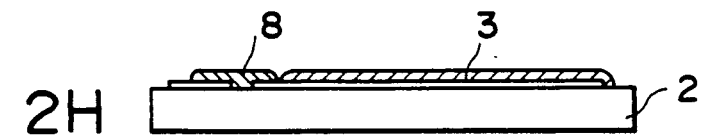
Figure 2I:
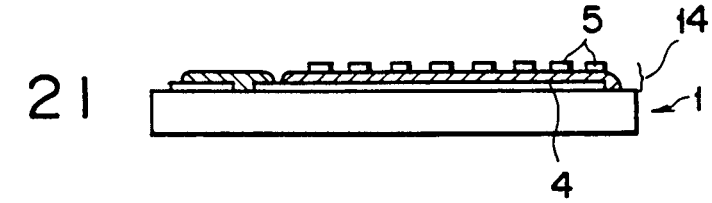

By effecting the same process as shown in FIGS. 2A to 2F, photoconductive layer 8 is formed on and between first electrode assembly 4 and common electrode 6 which is formed separately from the end portions thereof. The photoconductive material of photoconductive layer 8 may be obtained by inorganic material such as crystalline silicon, amorphous silicon or ZnO, polyvinyl carvazole (PVK), a combination of the derivative thereof and color sensitization agent, Lewis sensitization composite material formed of a combination of PVK and trinitrofluorenone (TNF), or organic material such as metal-free phthalocyanine of controlled crystal type. The photoconductive film can be formed by selectively effecting the sputtering method, vacuum deposition method or solvent coating method according to the property thereof. Then, as shown in FIG. 2H, ferroelectric thin film 3 is formed on substrate 2 on which the electrode pattern is formed in the manner described above. In this case, the ferroelectric material can be roughly divided into inorganic material such as PZT, PLZT, KNO$_3$, or BaTiO$_3$, and organic material such as fluoropolymer with vynilidene fluorine-trifluoroethylene copolymer of controlled polymerization ratio or polymer with cyanoradical such as vynilidene cyanide-vinylacetate copolymer. In a case where the inorganic material is used for the thin film formation, the dry film formation method such as the plasma sputtering method, ion beam sputtering method or vacuum deposition method is mainly used. Further, the wet film formation method such as the electrolytic method, the sol-gel method in which metal alkoxide is mixed in the preset composite ratio, the solvent is coated on substrate 2 and subjected to the firing process to form a film of the oxide crystal, and the spin-on method can also be used. Proper solvent can be selectively used for polymer organic material according to the chemical structure and composition ratio thereof, and therefore the film can be formed by effecting the coating-drying process in the spin coating method, dip method printing method or the like. Next, as shown in FIG. 2I, second electrode assembly 5 having stripe electrodes formed to extend in a direction perpendicular to the stripe electrodes of first electrode assembly 4 is formed on ferroelectric thin film 3. Second electrode assembly 5 may be formed in the same manner as shown in FIGS. 2A to 2F or by other known method. In this case, the photoconductive material may be the same as that of first electrode assembly 4 or may be other material in consideration of the material of ferroelectric thin film 3. At this time, second common electrode 7 is also formed at the same time as formation of second electrode assembly 5.

In this way, ferroelectric memory 1 described before is formed.

The construction of ferroelectric memory 1 is not limited to that shown in FIG. 1. It is possible to laminate a plurality of memory layers 14 which are each formed of first electrode assembly, ferroelectric thin film 4 and second electrode assembly 5 in the same manner. It is also possible to form on second electrode assembly 5 a protection film for the light shielding, anti-electrification, contamination prevention, moisture proof and the like.

Then, substrate 2 is cut to have preset dimensions, and connections with respect to common electrodes 6 and 7 are made to complete ferroelectric memory 1 described above.

Figure 3:
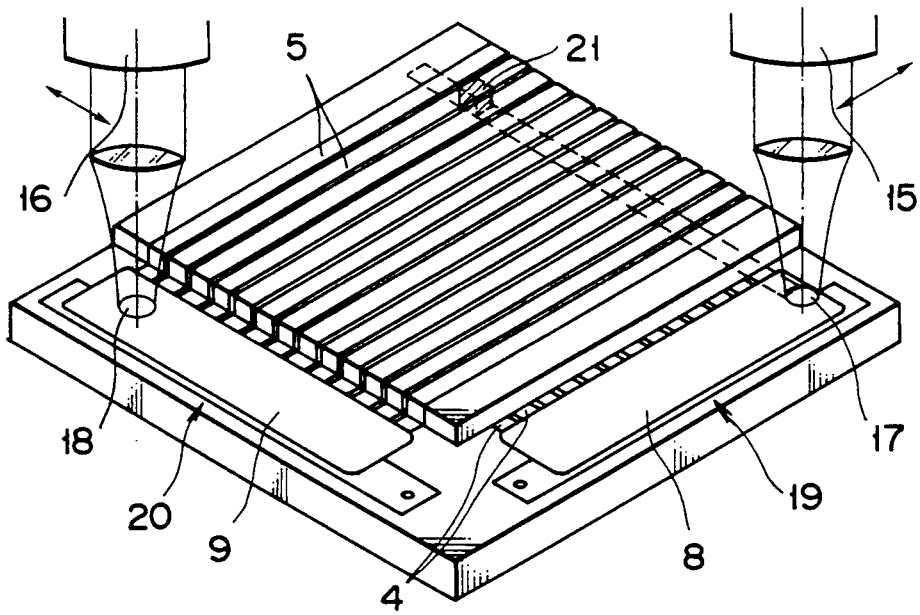
FIG. 3 is an illustrative view for explaining the read/write operation with respect to the ferroelectric memory of FIG. 1.

Now, the operation of writing data into or reading out data from the ferroelectric memory of the above construction is explained with reference to FIG. 3.

First, light beams having a diameter substantially equal to the width of each stripe electrode of electrode assemblies 4 and 5 are applied to desired portions of photoconductive layers 8 and 9 by means of light beam application means 15 and 16. As a result, the resistances of illuminated portions 17 and 18 are reduced so that a corresponding one of the stripe electrodes of electrode assembly 4 and a corresponding one of the stripe electrodes of electrode assembly 5 can be connected to common electrodes 6 and 7 via respective illuminated portions 17 and 18. Selection means 19 and 20 for selecting the stripe electrodes of electrode assemblies 4 and 5 by applying light beams onto photoconductive layers 8 and 9 from light beam application means 15 and 16 are hereinafter referred to optical multiplexers. If a certain voltage Ew (corresponding to the voltage more than voltage ±Es in FIG. 58) is applied between common electrodes 4 and 5, the polarization will occur in data storing portion (memory cell) 21 or that portion of ferroelectric thin film 3 at which the selected stripe electrodes intersect. In this case, if the polarity of a voltage applied between common electrodes 6 and 7 is changed, the direction of the polarization occurring in memory cell 21 may be changed. Thus, data can be written by setting the polarization directions to correspond to digital signals "1" and "0", respectively.

Now, the readout operation is explained. First, as in the case of the writing operation, light beam are applied to portions of the photoconductive layers which correspond to the stripe electrodes intersecting at memory cell 21 by means of optical multiplexers 19 and 20.

Figure 58:
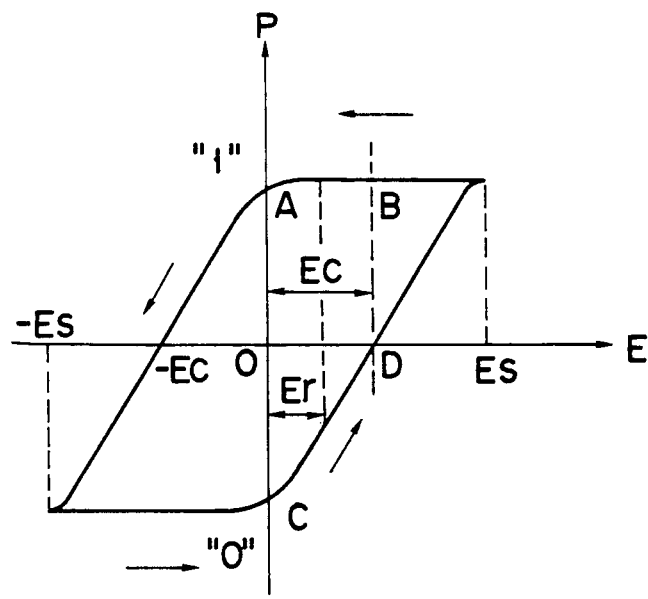
FIG. 58 shows the hysteresis characteristic of a ferroelectric material.
Figure 59:
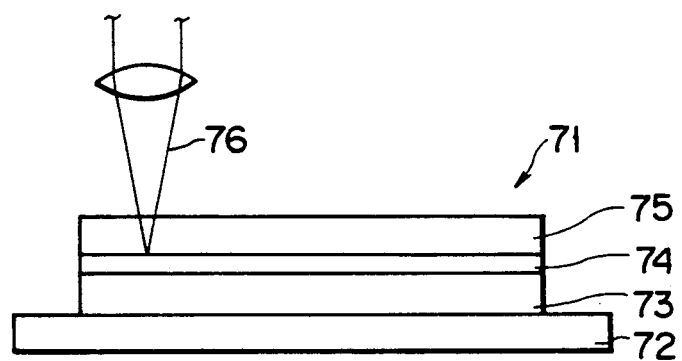
FIG. 59 shows a conventional ferroelectric memory.

Then, readout pulse EC shown in FIG. 58 is applied to selected memory cell 21 and the output therefrom is determined. As a result, the stored data can be read out.

Alternatively, another method of reading out data from selected memory cell 21 can be effected by heating the entire portion of the memory and detecting a pyroelectric current caused by the pyroelectric effect. Since the polarity of the pyroelectric current can be determined by the direction of the polarization, data can be read out by detecting the polarization direction. As another readout method, a method of detecting a voltage caused by the piezoelectric effect may be used. Since the polarity of the piezoelectricity can be determined by the direction of the polarization, data can be read out by detecting the polarization direction.

The memory capacity of ferroelectric memory 1 of the above construction is explained. In this case, the calculation is effected assuming that the area of ferroelectric thin film 3 is substantially the same as that (8 mm×15 mm) of the present semiconductor memory of 16 Mbits (0.5 μm rule). Since the stripe electrodes of electrode assemblies 4 and 5 each have a width of 0.5 μm and are arranged at an interval of 0.5 μm, it is possible to form memory cells capable of $120 \times 10^6$ each storing one information in the above-described area. That is, a memory capacity of 120 Mbits can be attained by use of substantially the same area as that of the semiconductor memory of 16 Mbits, the memory capacity eight times that of the conventional semiconductor memory can be attained by use of single-layered ferroelectric memory 1.

As described above, according to the ferroelectric memory of the above embodiment, a memory cell in which data is to be written or read out can be specified by applying light beams to the photoconductive layers used as the selection means to select the stripe electrodes of the first and second electrode assemblies. Further, each memory cell for storing information is restricted by portion of the ferroelectric thin film at which the selected stripe electrodes intersect and thus the memory cells are independent from one another. Therefore, data can be prevented from being erroneously written into or read out from the adjacent memory cell, and data can be correctly written into or read out from the selected memory cell.

Since the read/write operation of the memory cells arranged in a plane can be effected by one-dimensionally scanning light beams, the optical and electrical systems for scanning the light beam and reading/writing data can be made simple in construction.

Now, the detail construction of laminated type ferroelectric memory using ferroelectric memories 1 is explained.

Figure 4:
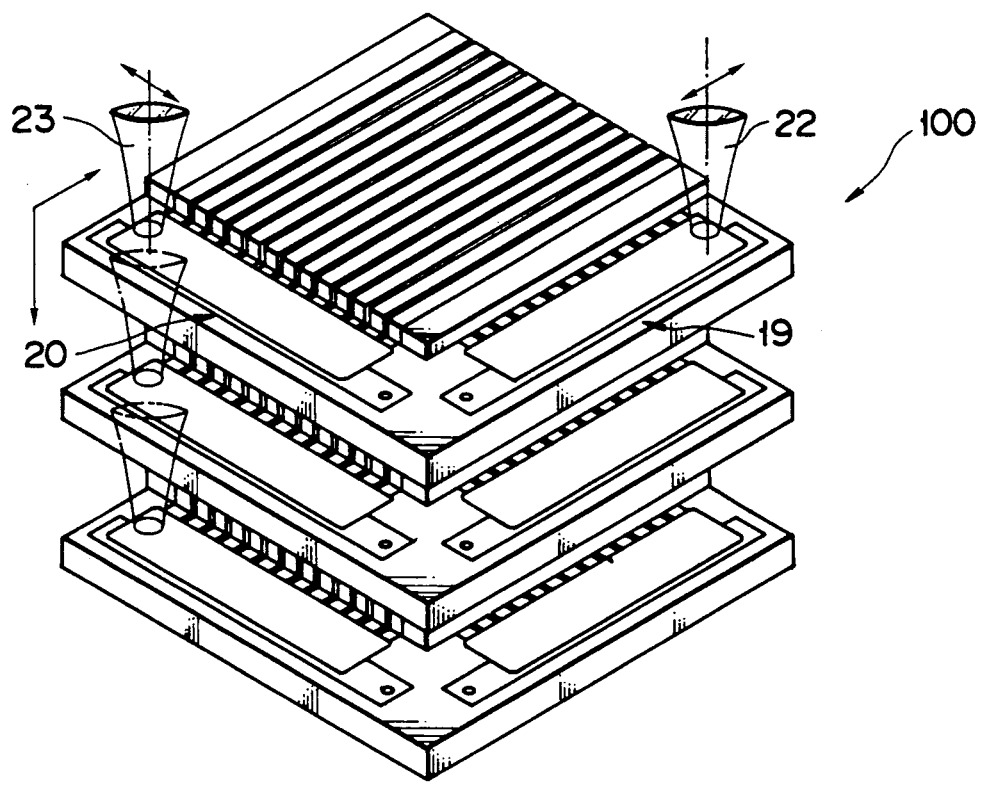
FIGS. 4 to 6 are schematic perspective views of laminated type ferroelectric memories according to other embodiments of this invention.
Figure 5:
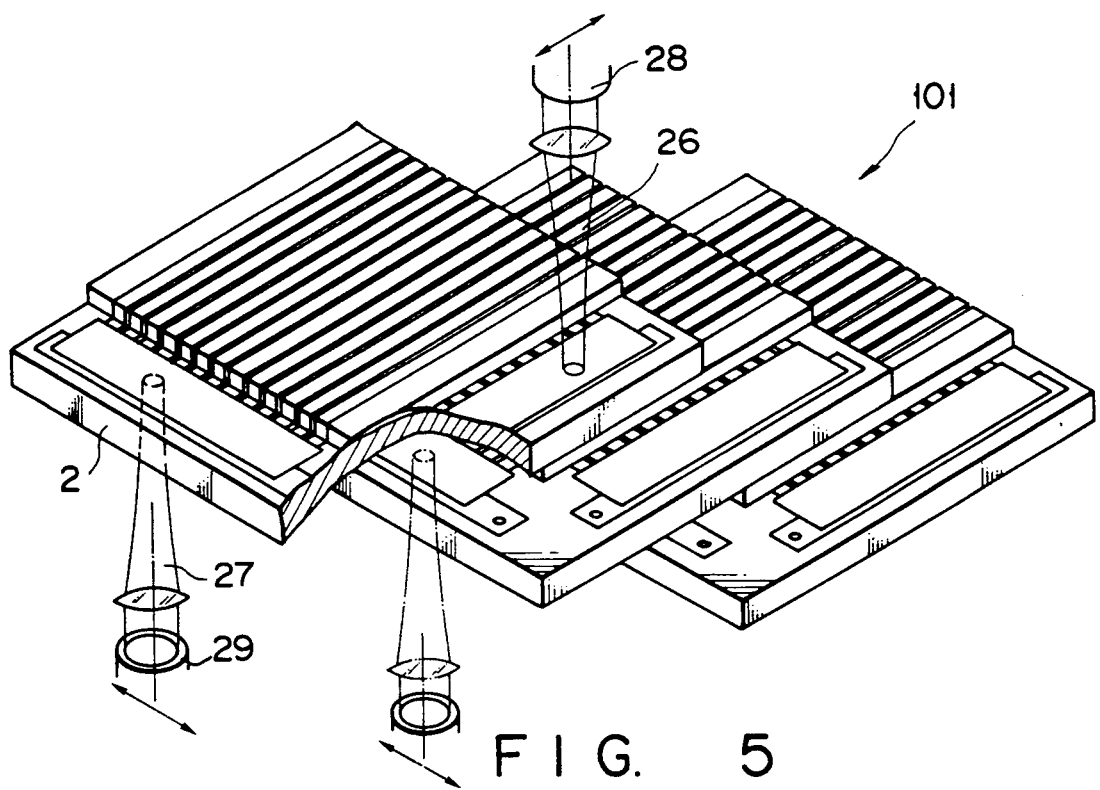
Figure 6:
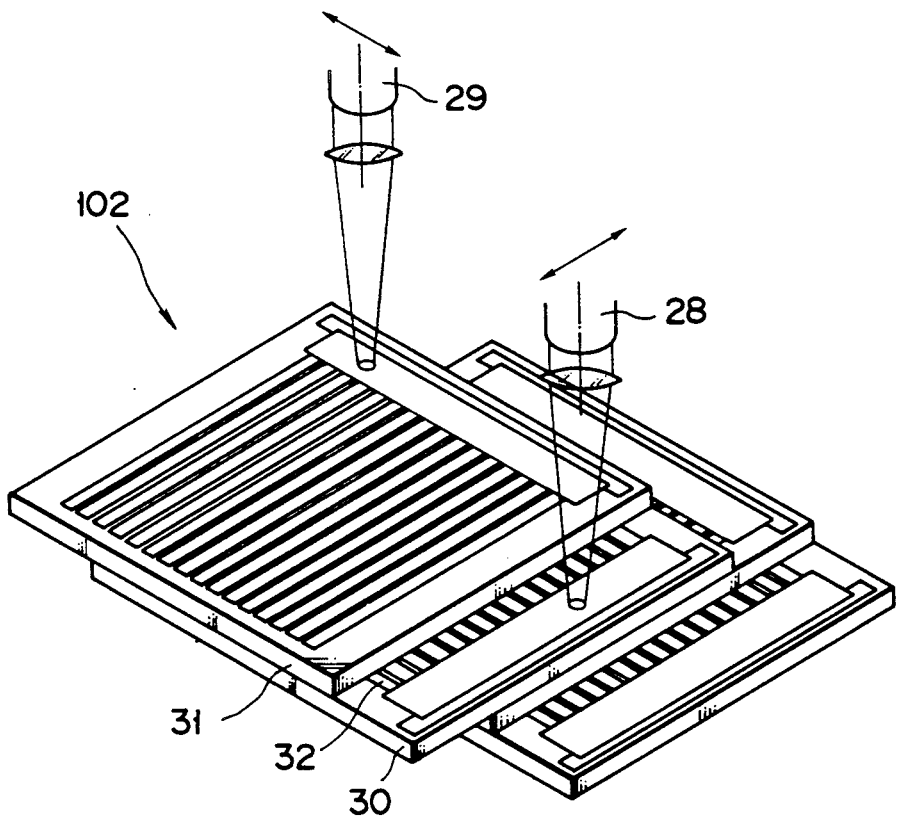

FIGS. 4 to 6 are perspective views illustrating laminated type ferroelectric memories according to other embodiments of this invention. As shown in FIG. 4, laminated type ferroelectric memory 100 is formed by laminating three ferroelectric memories 1 shown in FIG. 1. In this case, it should be noted that ferroelectric memories 1 are so laminated that optical multiplexers 19 and 20 of each ferroelectric memory 1 will not be covered with the upper substrate. That is, one of the memory layers can be selected by displacing the light beams in directions perpendicular to the respective photoconductive layers. In this way, memory cells 21 arranged in three dimensions can be selectively activated.

FIG. 5 shows laminated type ferroelectric memory 101 in which light beam application means 28 and 29 are disposed on the front and back sides of laminated type ferroelectric memory 101 to apply light beams to the front and back surfaces of laminated type ferroelectric memory 101. With the construction of laminated type ferroelectric memory 100 of FIG. 4, light beams 22 and 23 are both applied to the front surface of ferroelectric memory 100. In contrast, with the construction of FIG. 5, light beams are respectively applied to the front and back surfaces of the ferroelectric memory so that light beam application means 28 and 29 will not strike against each other even when light beams 26 and 27 are applied to corner portions of the ferroelectric memory which are close to the same corner thereof. However, when this construction is used, substrate 2 must be omitted or formed of transparent material.

FIG. 6 is a perspective view illustrating laminated type ferroelectric memory 102 according to another embodiment of this invention. With the construction of this embodiment, substrates 2 which have been disposed between respective laminated type memory layers in FIGS. 4 and 5 are omitted. The feature of this embodiment is that electrode assembly 21 disposed between ferroelectric thin films 30 and 31 is commonly used as the electrode assembly for ferroelectric thin films 30 and 31. Likewise, the second electrode assembly disposed between the second and third ferroelectric thin films is commonly used as the electrode assembly for the second and third ferroelectric thin films.

The memory capacity of laminated type ferroelectric memory 100, 101 and 102 of the above embodiments can be increased by increasing the number of laminated memory layers. For example, 10 memory layers are laminated, a memory capacity of 1.4 Gbits which corresponds to 80 times the memory capacity of the ordinary semiconductor memory with the same area can be attained. Even when 10 memory layers are laminated, the total thickness of the laminated type ferroelectric memory is 2 to 3 mm in a case where it is formed with substrates (in memories 100 15 and 101) and approx. 1 mm in a case where no substrate is used (in memory 102). Thus, the memory capacity can be increased while the total thickness of the ferroelectric memory is kept sufficiently thin.

Figure 7:
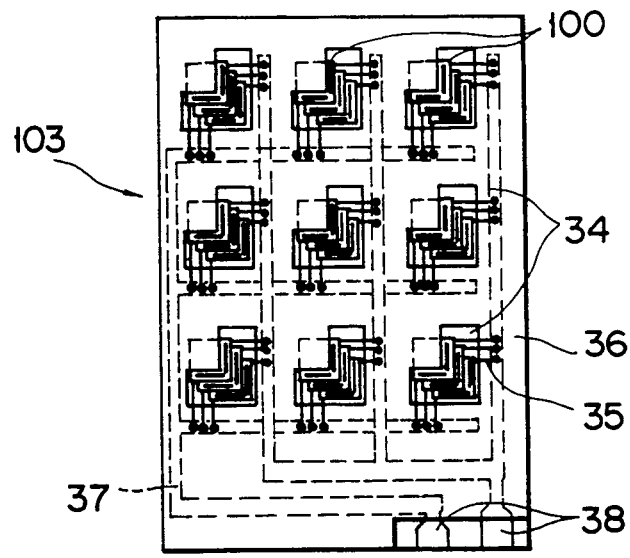
FIG. 7 shows a memory card using a laminated type ferroelectric memory.
Figure 8:
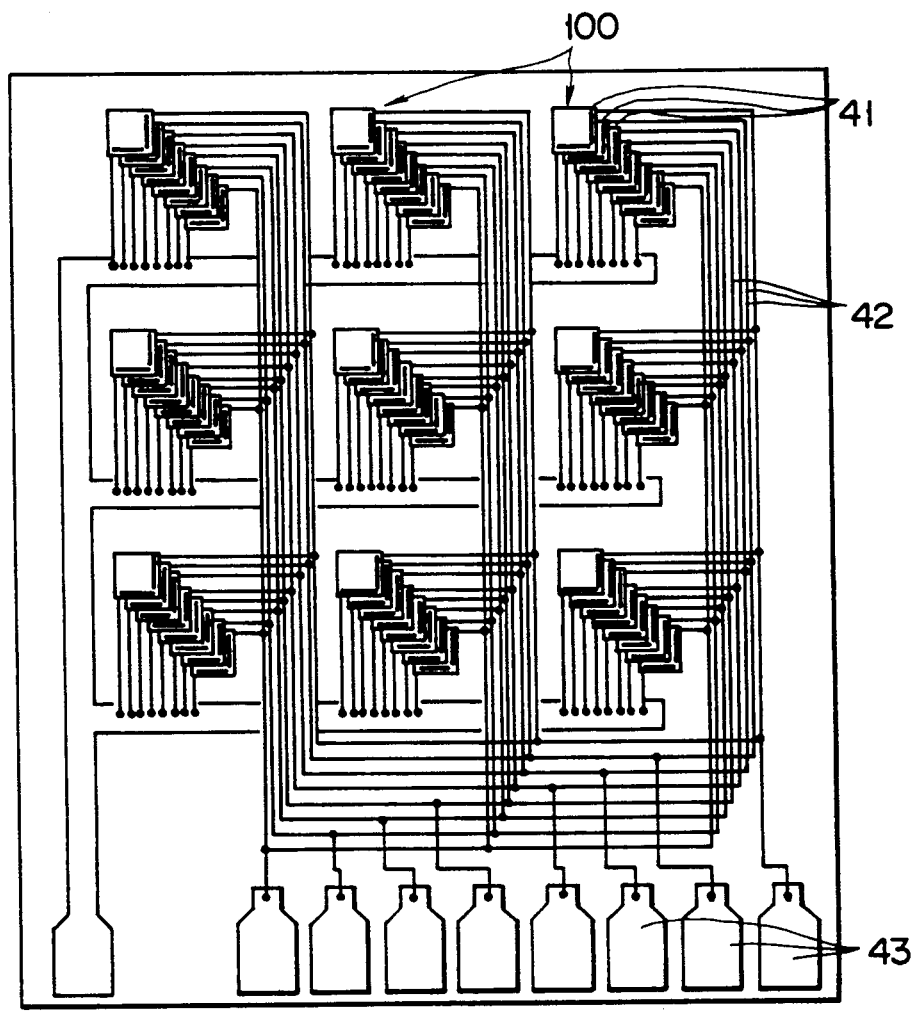
FIG. 8 is a schematic view of the wiring arrangement for effecting the data read/write operation in a parallel fashion.
Figure 9:
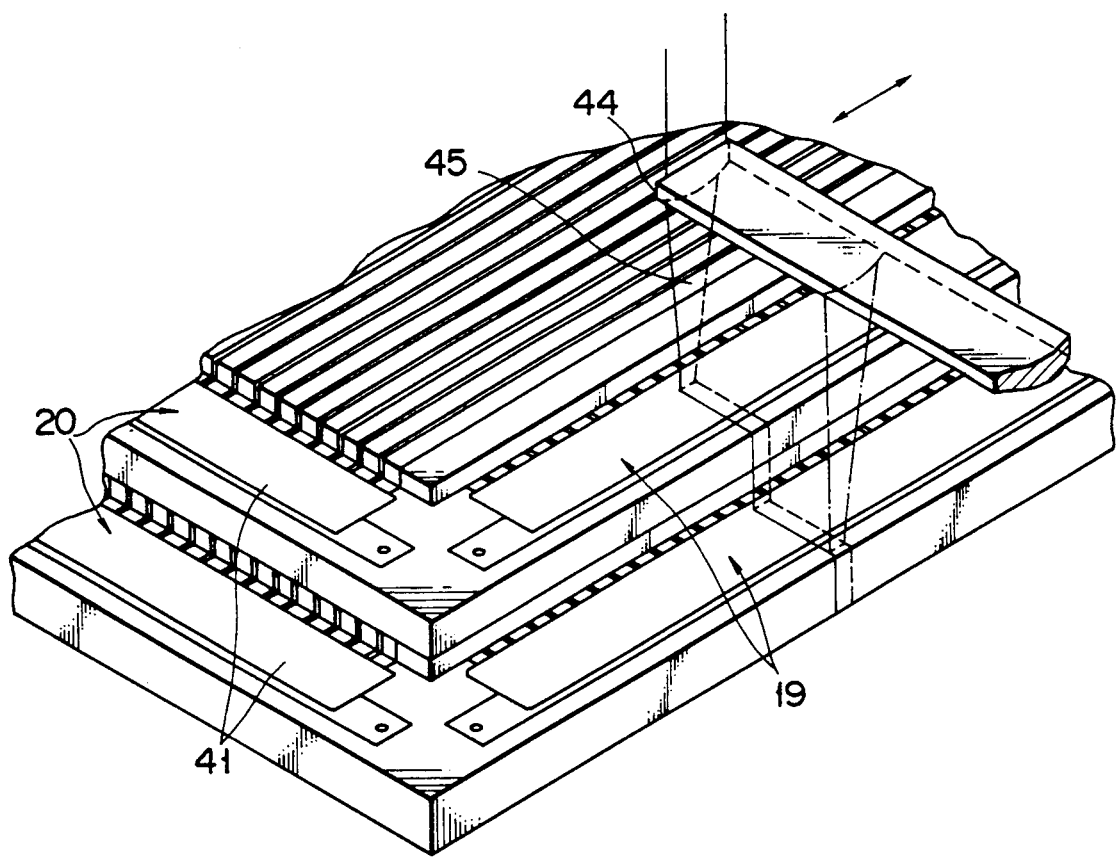
FIG. 9 is a schematic view showing the manner of application of a light beam for effecting the data read/write operation in a parallel fashion.

Next, an embodiment in which the above laminated type ferroelectric memory is used to form memory card 102 is explained. FIG. 7 shows an embodiment in which nine laminated type ferroelectric memories 100 are disposed in memory card 103 in an array of 3 rows×3 columns. The main reason whey a plurality of laminated type ferroelectric memories 100 are arranged to form a memory card is that the film formation and electrode etching (lithography) can be more easily effected when the area to be processed is smaller and it is particularly advantageous when forming the above memory card. Portions corresponding to optical multiplexers 19 and 20 are covered with transparent material 34. Other portions of the outer periphery are covered with material suitably selected in consideration of the mechanical strength and anti-electrification. In order to attain a serial type memory in which data is written or read out bit by bit, common electrodes 6 and 7 of each laminated type ferroelectric memories 100 are connected to respective lead electrodes 37 formed on substrate 36 via bonding wires 35 of Au or Al and then connected to connectors 38. The polarity number of connectors 38 required at this time is 2. In contrast, where a parallel type memory is formed, bits to be transferred in parallel are allotted to correspond to laminated memories as shown in FIG. 8. Further, in this case, light beam 45 is applied to each of optical multiplexers 19 and 20 by means of cylindrical lens 44 as shown in FIG. 9 so as to read out or write data. Common electrodes 41 for parallel bits are connected to lead electrodes 42 formed on the substrate and corresponding to the parallel bits via bonding wires as shown in FIG. 8 and then connected to connectors 43. The polarity number of connectors required at this time is equal to the number of parallel bits (one byte in FIG. 8).

An embodiment in which optical multiplexers 19 and 20 of the memory card are operated at a high speed is explained with reference to FIGS. 10 and 11. The mechanism to be described now is disposed in a device (memory driver) for reading or writing data with respect to the memory. The following explanation is made assuming that the read/write operation is effected in a parallel fashion.

Figure 10:
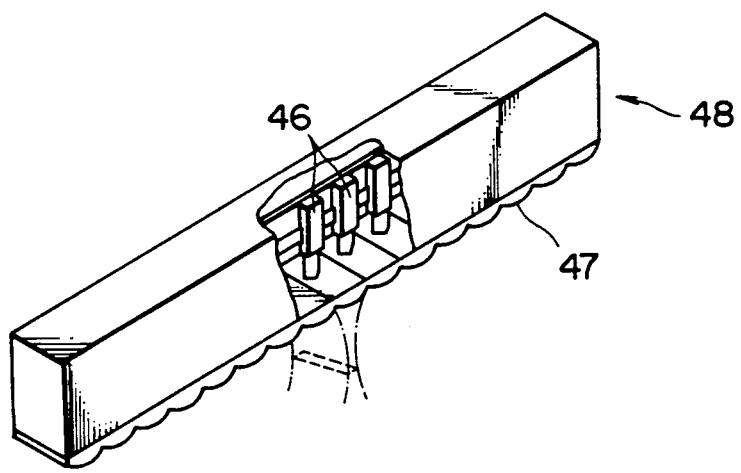
FIG. 10 is a perspective view showing the array of light emitting elements used for effecting the data read/write operation with respect to the ferroelectric memory.
Figure 11:
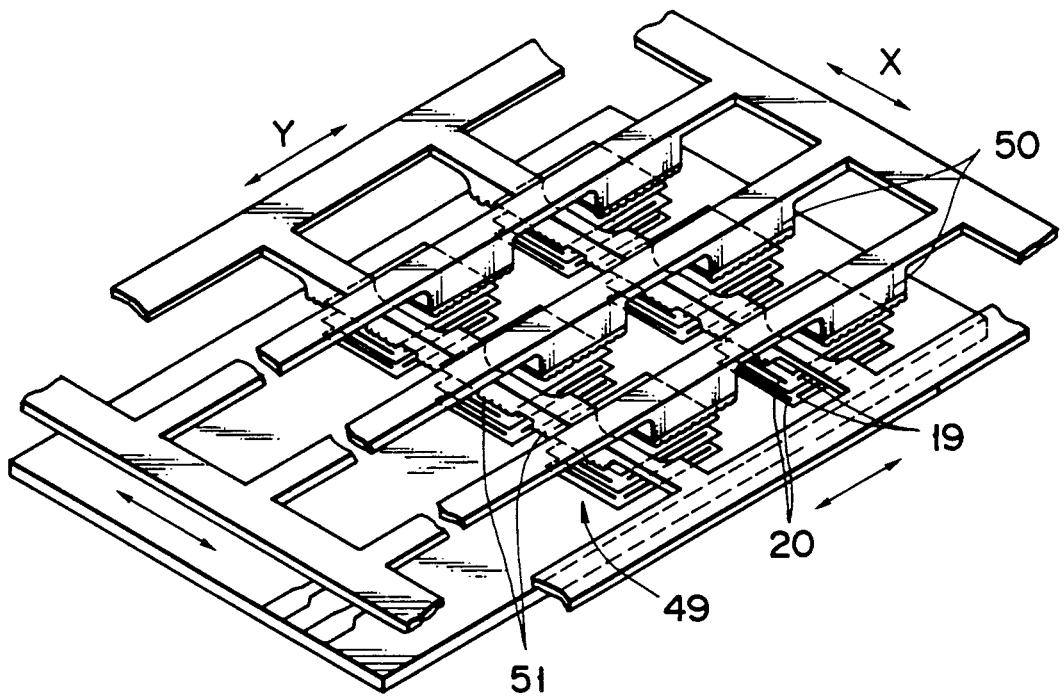
FIG. 11 is a perspective view showing read/write device using the light emitting elements of FIG. 10.

FIG. 10 shows light emitting element array 48 used for reading and writing data with respect to the above laminated type ferroelectric memory. Light emitting element array 48 and 400 light emitting elements 46 arranged at an interval of 60 μm. Light emitting element 46 may be an electroluminescence device (ELD) or light emitting diode (LED) which is used as a recording head in a page printer, for example. In this embodiment, cylindrical lenticular lenses 47 are each disposed on the light emitting portion of each element, and therefore the light beam ca be focused only in the array direction of the light emitting elements. In this case, the light beam has a preset width in a direction perpendicular to the array direction and corresponding to the length of the lenticular lens. As shown in FIG. 11, light emitting element array groups 50 and 51 formed of a plurality of light emitting elements having the same construction as light emitting element 48 shown in FIG. 10 are arranged in two dimensional positions corresponding to optical multiplexers 19 and 20 of laminated type ferroeleotric memory 100. Light emitting element array groups 50 arranged in X direction and light emitting element array groups 51 arranged in Y direction are formed with high mechanical strength. Light emitting element array groups 50 and 51 can be independently shifted in X and Y directions by one pitch of the light emitting elements for each shifting operation by means of an actuator (not shown). That is, the stripe electrodes can be selected by selectively activating light emitting elements 46, and laminated type ferroelectric memories 1 can be selected by shifting light emitting element array groups 50 and 51. In this way, optical multiplexers 19 and 20 of the memory card (FIG. 8) can be selectively activated at a high speed. Further, light emitting element array groups 50 and 51 can be driven in the respective focusing directions. In light emitting element array 48, ELDs or LEDs which individually emit light are used as light emitting elements 46, but a combination of a light source and a liquid crystal shutter array used in, for example, a liquid crystal printer can be used.

Next, other embodiments in which optical multiplexers 19 and 20 used as the selection means are modified are explained with reference to FIGS. 12 to 14.

Figure 12:
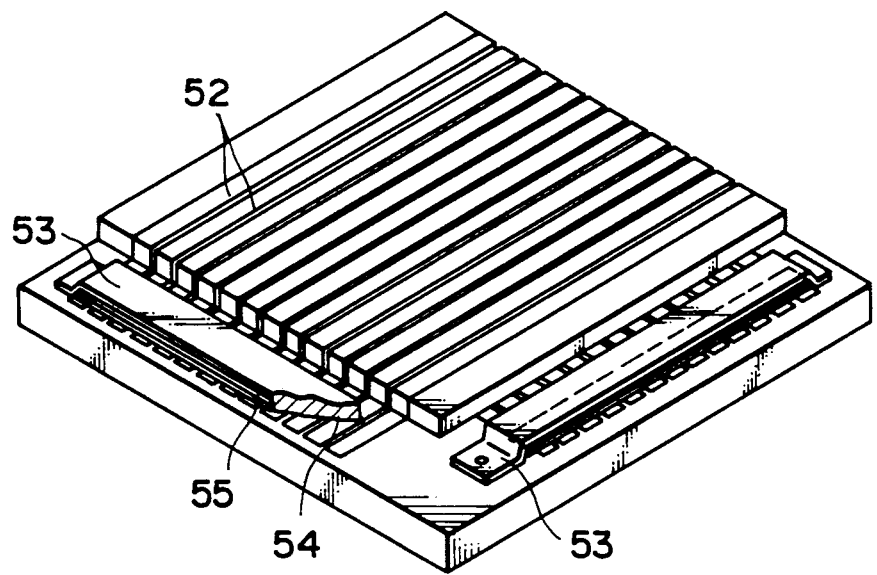
FIGS. 12 and 14 are perspective views of ferroelectric memories according to other embodiments of this invention.

As shown in FIG. 12, photoconductive layer 54 and auxiliary electrode 55 are disposed between end portions of stripe electrodes 52 and common electrode 53. In this case, common electrode 53 is formed of a transparent electrode. When a light beam is applied to photoconductive layer 54 via common electrode 53, the resistance of the activated portion of photoconductive layer 54 can be significantly reduced since the effective area of the electrodes facing each other with photoconductive layer 54 disposed therebetween can be set to be larger in comparison with the distance between the adjacent electrodes. Further, since auxiliary electrode 55 formed of good electrical conductor such as Au, Al is arranged, the impedance of common electrode 53 in a lengthwise direction thereof can be reduced so that the time constant can be reduced, permitting data to be read out or written at a high speed.

Figure 13:
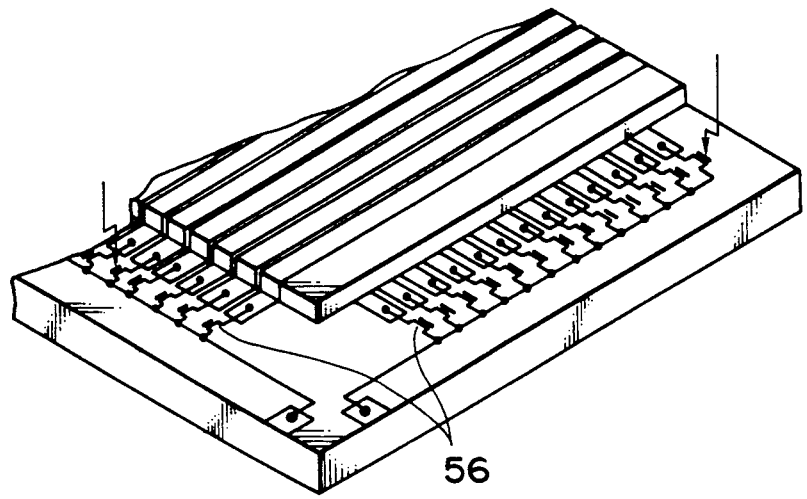

FIG. 13 shows an embodiment in which photoconductive layers 8 and 9 shown in FIG. 1 are omitted, and semiconductor switches (for example, optical FETs) 56 which can be optically controlled and formed in the IC form are connected as the selection means between the stripe electrodes and the common electrode. In the embodiment using optical FETs 56, the read/write operation can be effected by applying light beams in the same manner as described above and the same effect can be attained. Further, the ON-resistance of the optical FET is small, and therefore the operation speed can be further enhanced.

Figure 14:
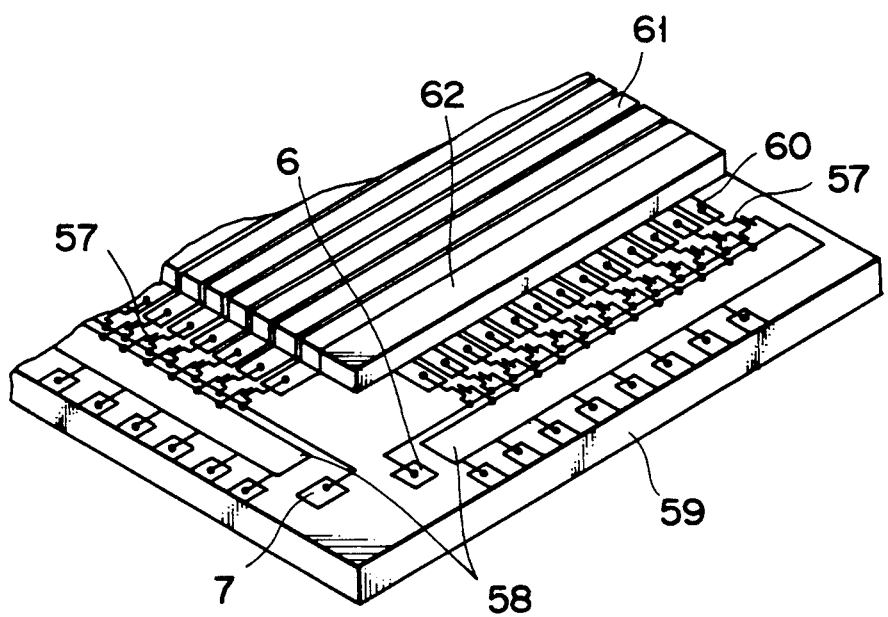

In an embodiment of FIG. 14, semiconductor switch 57 which can be electrically controlled and control section 58 therefor are formed in the IC form and disposed on substrate 59 as the selection means Further, electrode assemblies 60 and 61 and ferroelectric thin film 62 are disposed on substrate 59. With the ferroelectric memory of this embodiment, since the memory cell can be electrically selected, means for mechanically applying the light beam as in the above embodiments can be omitted and the high speed operation can be attained. Thus, since the ferroelectric memory of each embodiment can be constituted by using stripe electrodes, it can be formed with a high density in comparison with the conventional semiconductor memory such as DRAM and SRAM. Further, since data can be stored by using the residual polarization of the ferroelectric thin film, it can be used as a nonvolatile memory which does not consume power for holding the stored data.

Next, there is explained an embodiment in which a countermeasure is taken to prevent the crosstalk from occurring between the selected memory cell and an adjacent memory cell in the above ferroelectric memory to enhance the SN ratio.

Figure 15:
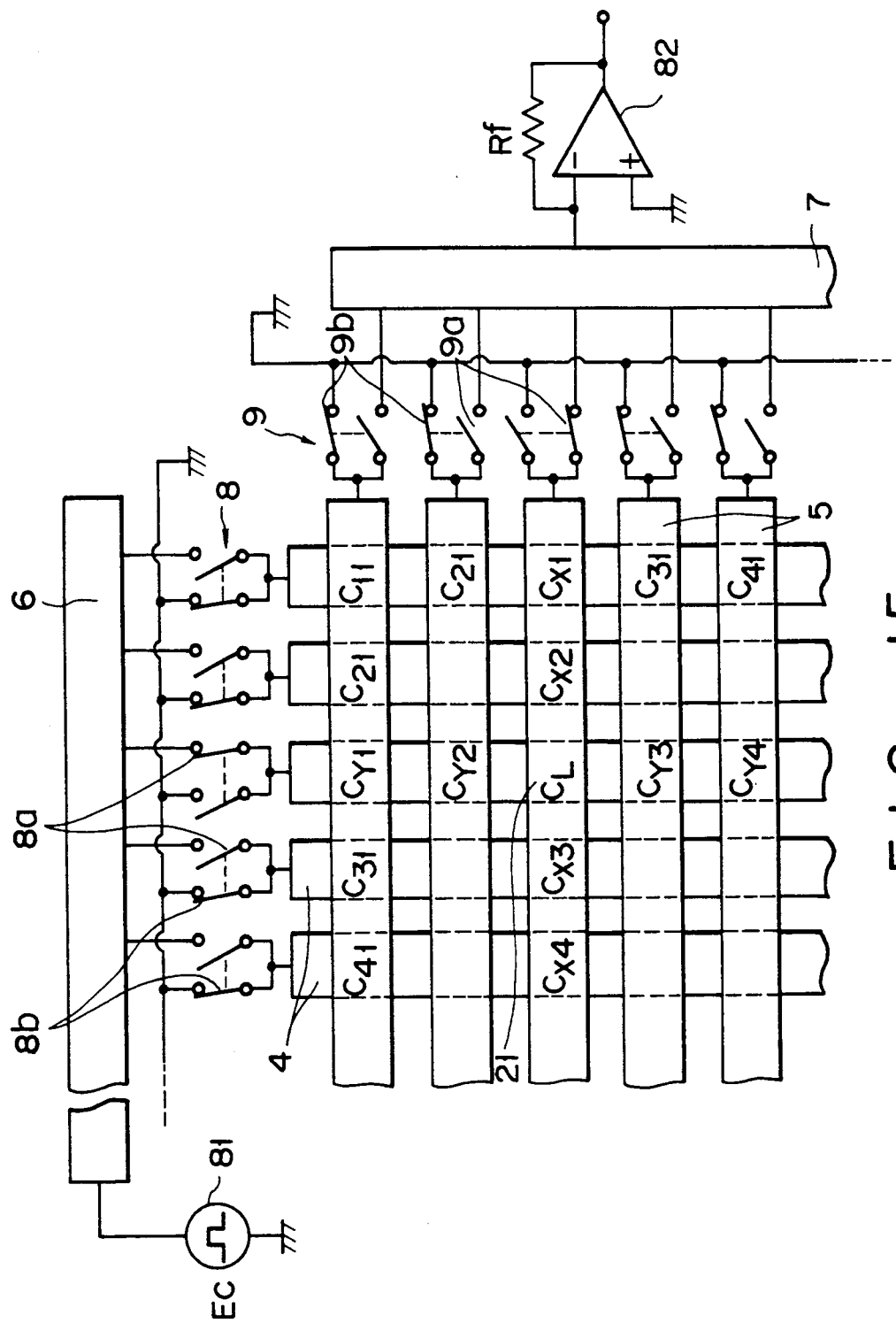

FIG. 15 is a diagram for explaining an embodiment of a ferroelectric memory in which means for preventing the crosstalk is provided. FIG. 16 is a circuit diagram showing the equivalent circuit of selected memory cell 21 in the embodiment of FIG. 15. In FIG. 16, $C_X$ is the resultant capacitance of memory cells arranged at intersections (X direction) between a selected one of the stripe electrodes of first electrode assembly 4 and nonselected ones of the stripe electrodes of second electrode assembly 5, and $C_Y$ is the resultant capacitance of memory cells arranged at intersections (Y direction) between nonselected ones of the stripe electrodes of first electrode assembly 4 and a selected one of the stripe electrodes of second electrode assembly 5. In this case, since the nonselected stripe electrodes of first and second electrode assemblies 4 and 5 are grounded, resultant capacitance $C_{XY}$ of the nonselected memory cells can be neglected.

As shown in FIG. 15, selection means 8 and 9 for selectively connecting first and second electrode assemblies 4 and 5 to respective common electrodes 6 and 7 are each formed of paired switches 8a, 8b or 9a, 9b connected to respective stripe electrodes. Switches 8a connected to respective stripe electrodes of first electrode assembly 4 are all connected to driver circuit 81 for generating a readout of write-in pulse via first common electrode 6, and switches 8b are all grounded. Likewise, switches 9a connected to respective stripe electrodes of second electrode assembly 5 are all connected to output amplifier 82 via second common electrode 78, and switches 9b are all grounded. One of switches 8a and 8b or switches 9a and 9b is turned ON while the other switch is turned OFF. With the above construction, nonselected stripe electrodes are all grounded. In this case, the output impedance of driver circuit 81 is set to be sufficiently smaller than impedance ($1/\omega C_Y$) due to resultant capacitance $C_Y$, and input impedance of amplifier 82 is set to be sufficiently smaller than impedance ($1/\omega C_X$) of resultant capacitance $C_X$. This ensures that a voltage can be applied to selected memory cell 21 without lowering voltage at point A in FIG. 16 with respect to the output voltage of driver circuit 81, and that most of the current flowing through the selected memory cell can be supplied to amplifier 81, thus reading out data from the selected memory cell with high reliability. According to this embodiment, as is clearly seen from FIG. 15, since capacitors $C_X$ and $C_Y$ of memory cells adjacent to the selected memory cell are grounded, most part of readout current flows into the amplifier via the selected memory cell so that data can be correctly read out from the selected memory cell without receiving any influence by $C_X$ and $C_Y$ or causing any crosstalk.

Figure 17:
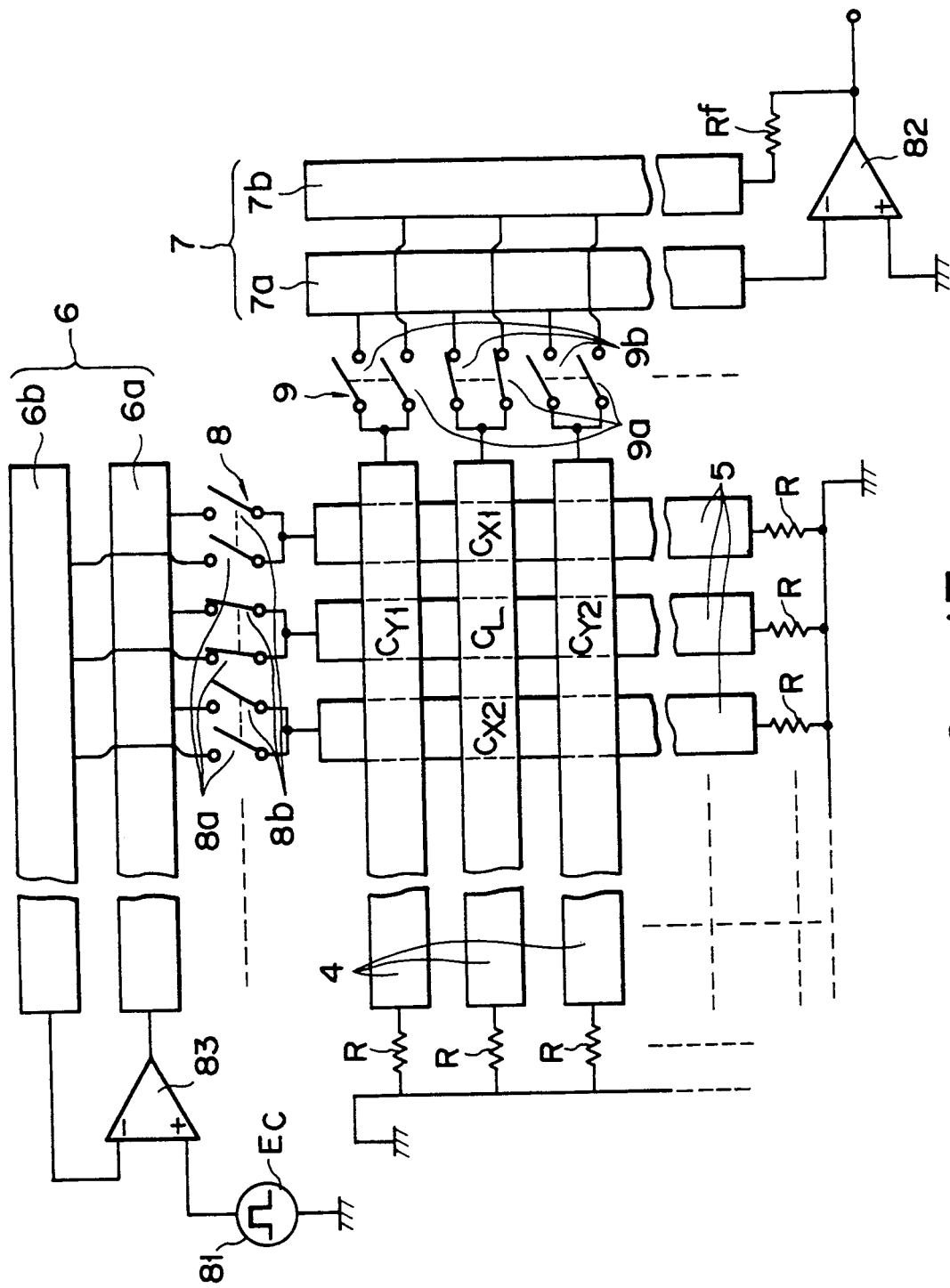

FIG. 17 is a diagram showing another embodiment in which the crosstalk is prevented, and FIG. 18 is an equivalent circuit of a selected memory cell in this embodiment. As shown in FIG. 17, those ends of the stripe electrodes of the first and second electrode assemblies which are not connected to selection means 8 and 9 are grounded via respective resistors R. As in the former embodiment, each of selection means 8 and 9 for selectively connecting the stripe electrodes of first and second electrode assemblies 4 and 5 to first and second common electrodes 6 and 7 is formed of a plurality of paired parallel switches 8a and 8b or 9a and 9b, each pair being connected to a corresponding one of the stripe electrodes. In this embodiment, both switches 8a and 8b or 9a and 9b are set in the same switching positions. Further, each of first and second common electrodes 6 and 7 has a pair of common electrode portions 6a and 6b or 7a and 7b. Common electrode portion 6a connected to first electrode assembly 4 via switching section 8 is connected to the output terminal of amplifier 83, and common electrode portion 6b connected to first electrode assembly 4 via switching section 8 is connected to the negative input terminal of amplifier 83. The positive input terminal of amplifier 83 is connected to driver circuit 81 for generating a read/write pulse. Common electrode portion 7a connected to second electrode assembly 5 via switching section 9 is connected to the negative input terminal of amplifier 82, and common electrode portion 7b connected to second electrode assembly 5 via switching section 9 is connected to the output terminal of amplifier 82 via resistor Rf. The positive input terminal of amplifier 82 is grounded. In this way, amplifiers 82 and 83 each constitute a negative feedback circuit.

Since each selection means has the ON-resistance, the equivalent circuit of the selected memory cell can be obtained as shown in FIG. 18. As described above, amplifiers 82 and 83 each constitute a negative circuit, and ON-resistors r1, r2, r3 and r4 of the selection means are included in the negative feedback circuits. Assuming that the open loop gain of amplifier 83 is 1, then the output impedance of amplifier 83 is $r2/\alpha 1$ when viewing driver circuit 81 from point A in FIG. 18. Since, in this case, the output impedance can be neglected if c1 is sufficiently larger than r2, a readout voltage can be applied to the selected memory cell without receiving influence of resultant capacitance $C_Y$ causing the crosstalk. Further, assuming that the open loop gain of amplifier 82 is $\alpha 2$, then the input impedance of amplifier 82 is $(r3+Rf)/\alpha 2$ when viewed from point B in FIG. 18. Since, in this case, the input impedance can be neglected if $\alpha 2$ is sufficiently larger than $(r3+Rf)$, a current from the selected memory cell will not flow into resultant capacitor $C_X$ causing the crosstalk. Thus, most part of the current is supplied to output amplifier 82, permitting data to be read out with high reliability. With the circuit construction of this embodiment, since influence by the ON-resistance of the switch can be eliminated, data can be read out more reliably in comparison with the former embodiment. FIGS. 19 to 23 show the construction of the selection means which can effect simultaneous ON-OFF operation with respect to paired electrode portions 6a and 6b or 7a and 7b used in this embodiment.

Figure 19:
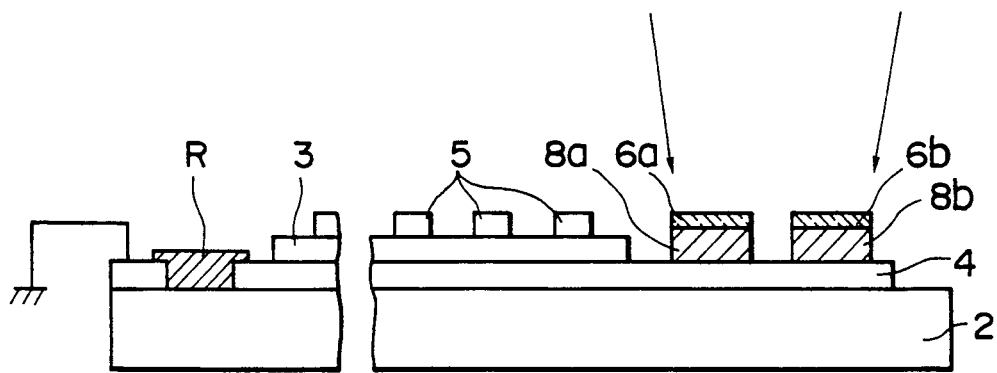
Figure 20:
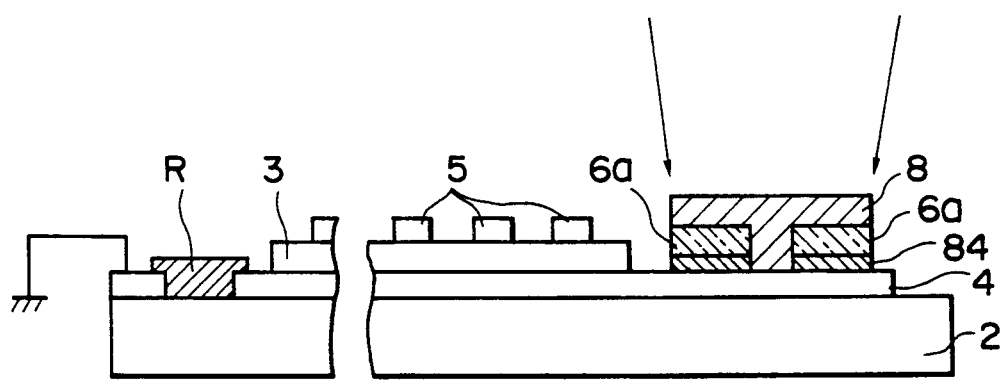
Figure 21:
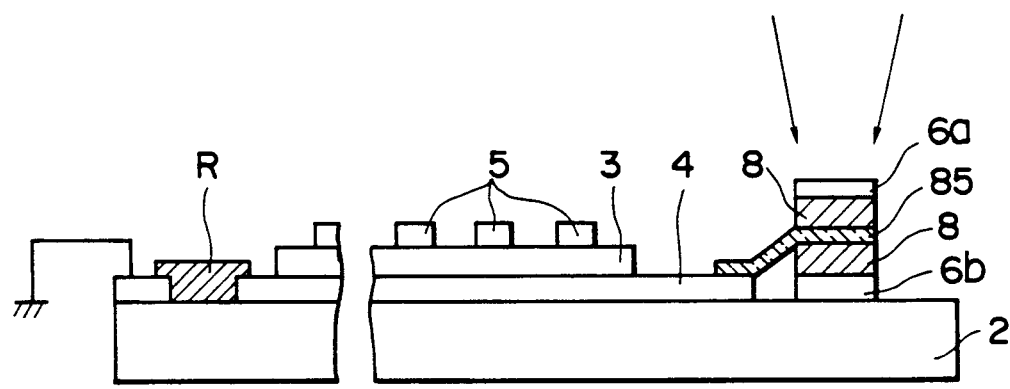

FIGS. 19 to 21 are cross sections of the selections means using a photoconductive layer or layers.

The selection means shown in FIG. 19 includes photoconductive layers 8a and 8b separately disposed on first electrode assembly 4 which is in turn formed on substrate 2, and two common electrode portions 6a and 6b each formed of a transparent electrode are formed on photoconductive layers 8a and 8b. In this example, in order to simultaneously connect electrode assembly 4 to both common electrode portions 6a and 6b, a light beam having such a width that the two common electrode portions can be illuminated at the same time is used, for example.

The selection means shown in FIG. 20 includes insulation films 84 separately disposed on first electrode assembly 4 which is in turn formed on substrate 2, and photoconductive layer 8 which is formed on electrode assembly 4 and two common electrode portions 6a and 6b each formed of a transparent electrode and disposed on respective insulation films 84. In this example, the same type of light beam as in the former example is applied.

The selection means shown in FIG. 21 includes a pair of photoconductive layers 8 disposed between two common electrode portions 6a and 6b one of which is disposed on substrate 2, and transparent electrode 85 disposed between the pair of photoconductive layers 8 and connected to first electrode assembly 4 which is in turn formed on substrate 2. Common electrode portion 6a which is disposed on the upper one of paired photoconductive layers 8 is formed of a transparent electrode. In this example, the width of the light beam may be set to be equal to that of one common electrode portion.

Figure 22:
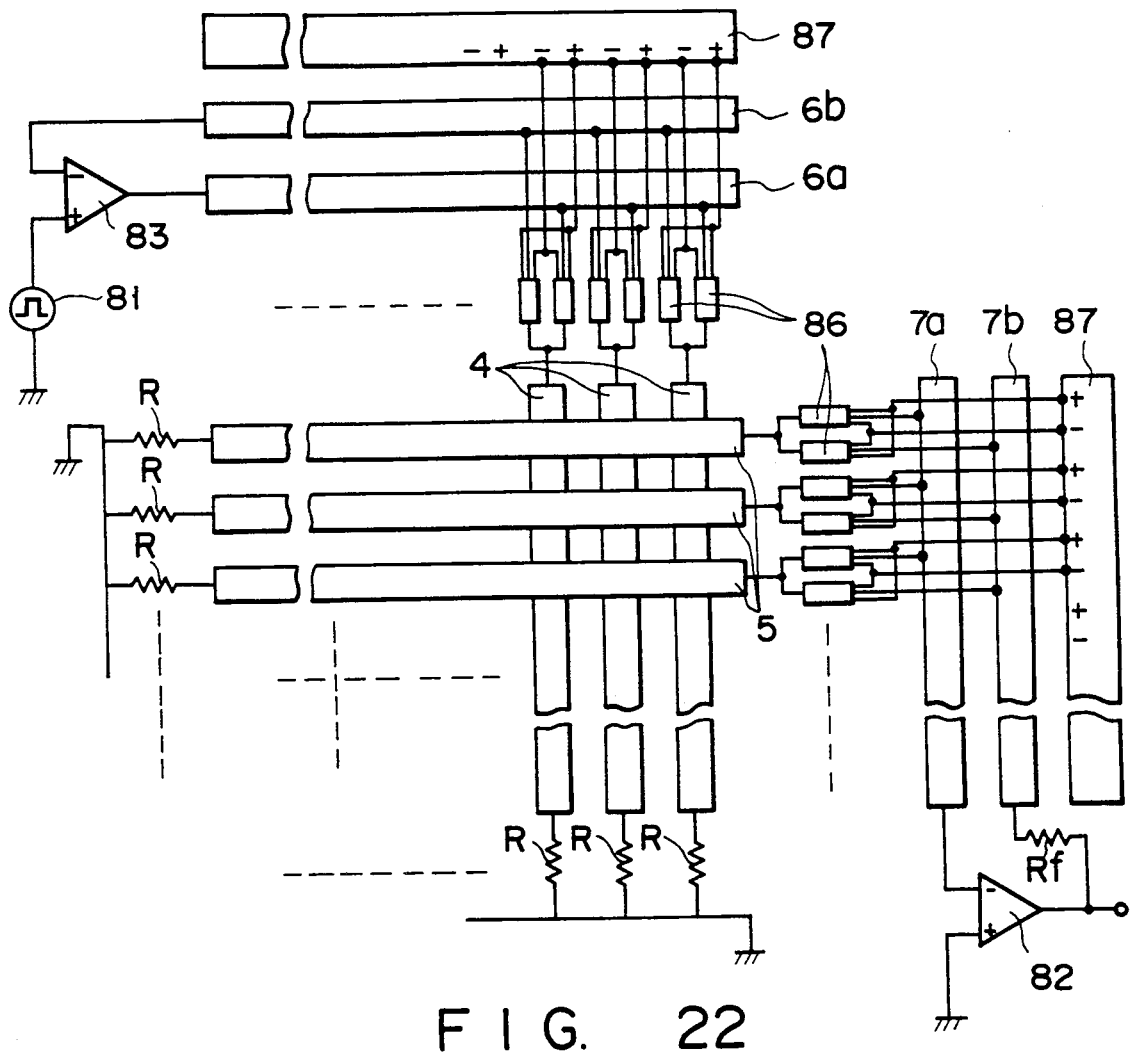
Figure 23:
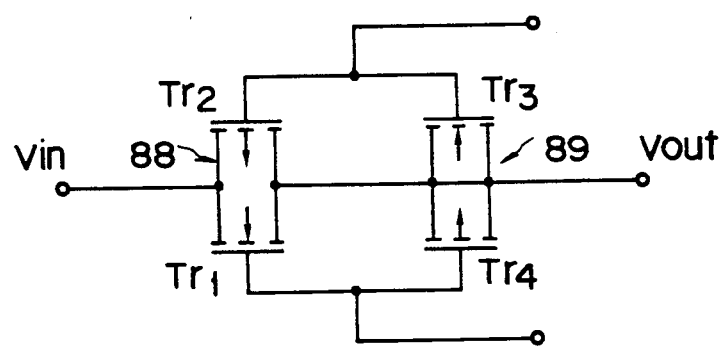

FIG. 22 shows an embodiment in which semiconductor switches are used as the selection means, and FIG. 23 shows a CMOS switch used as an example of the semiconductor switch.

As shown in FIG. 22, two parallel semiconductor switches 86 are connected as the selection means to each of the stripe electrodes of the first and second electrode assemblies, and paired semiconductor switches 86 are connected to common electrode portions 6a and 6b or 7a and 7b. The control gate of each semiconductor switch is connected to decoder 87 acting as a control section. Each pair of semiconductor switches are controlled in response to selection signals generated from decoder 87 according to a control signal from a control circuit (not shown) and thus the switching positions thereof are controlled at the same time. As shown in FIG. 23, the CMOS switch used as an example of semiconductor switch 86 includes switching transistor section 8 formed of CMOS transistors Tr1 and Tr2 and charge cancelling transistor section 89 having CMOS transistors Tr3 and Tr4 connected to the output terminals of the switching transistors and having an area substantially half that of the switching transistors. The semiconductor switch thus formed is connected at its input terminal Vin to first common electrode portion 6a or 6b and at its output terminal Vout to first electrode assembly 4. The gate electrodes of transistors Tr1 and Tr4 are connected together and the gate electrodes of transistors Tr2 and Tr3 are connected together. Further, these electrodes are connected to decoder 87 to receive signals in an inverted relation. The source-drain paths of transistors Tr3 and Tr4 of charge canceling transistor section 89 is shorted, and only the gate capacitances thereof are used. The gate of transistor Tr3 is supplied with a signal in an inverted relation with respect to a signal supplied to the gate of transistor Tr1 so as to compensate for the leakage of the gate signal caused when transistor Tr1 is turned off by means of transistor Tr3. This is also applied to the relation between transistors Tr2 and Tr4. By use of the selection means, means for mechanically operating the light beam can be omitted and the high operation speed can be attained.

The readout operation can be reliably effected by use of the circuit of this embodiment. However, when data is written into a selected memory cell in the circuit, the data may happen to be written into a memory cell adjacent thereto. This is because the same voltage is applied to capacitors $C_L$ and $C_Y$ if it is assumed that a circuit portion between point C and the output terminal in the equivalent circuit of FIG. 18 is grounded.

Figure 25:
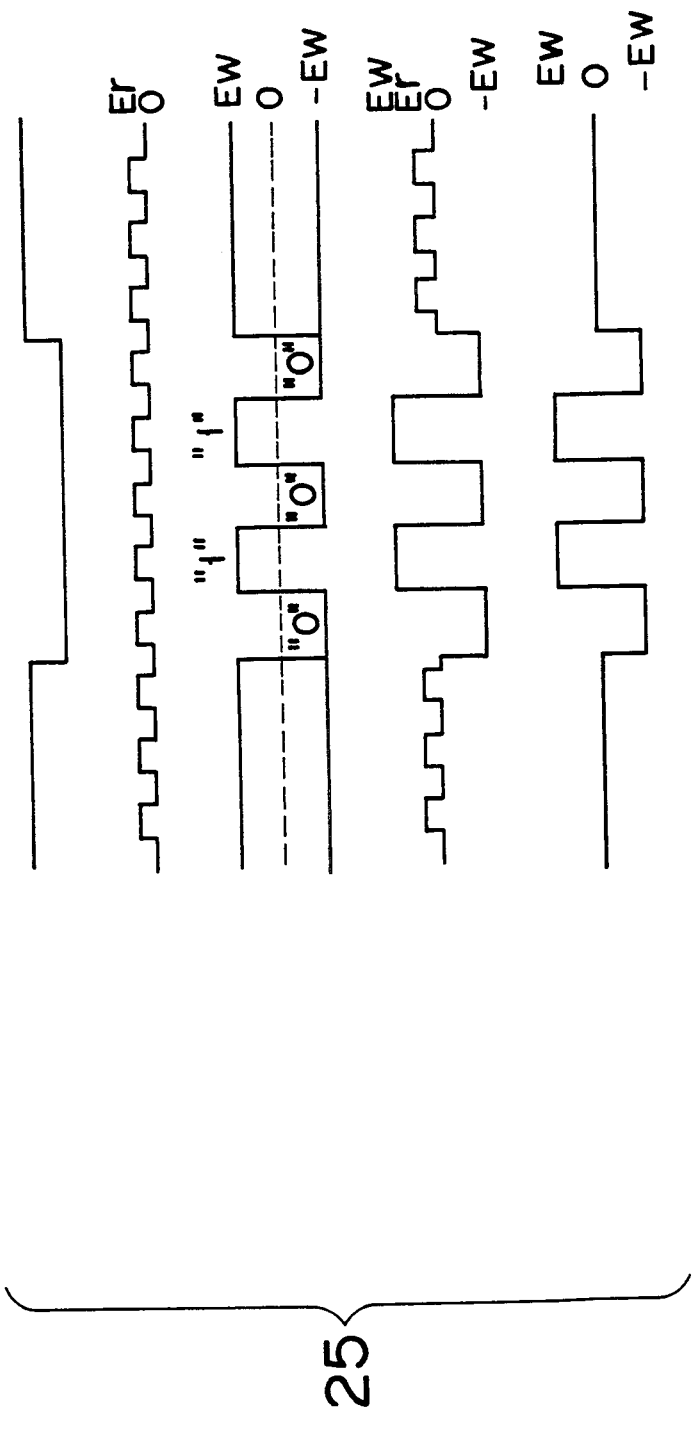

FIGS. 24 to 26 show an embodiment in which the crosstalk can be prevented not only in the readout mode but also in the write-in mode, thus permitting the readout and write-in operations to be effected with high reliability.

FIG. 24 is a circuit diagram showing the construction of this embodiment, FIG. 25 is a timing chart showing the selection timings of read/write pulses in the circuit of this embodiment, and FIG. 26 is a circuit diagram showing an equivalent circuit of a memory cell selected in the write-in mode in this embodiment.

The circuit of this embodiment is different from that of the embodiment shown in FIG. 17 in the following respects. That is, in this embodiment, amplifier 90 connected to receive a gate signal for selecting the read or write mode, comparison amplifier 91 for generating a write pulse in response to a write data signal, and switches 92a, 92b, 92c and 92d for setting the read or write mode in response to the gate signal are provided, and the stripe electrodes of first and second electrode assemblies 4 and 5 are not grounded via resistors R but connected to the output terminals of impedance converters 93a and 93b via resistors R. Further, the input terminals of impedance converters 93a and 93b are grounded via resistors R2 and R3.

Driver circuit 81 for generating a read pulse is connected to amplifier 83 via switch 92a. Further, the output terminal of comparison amplifier 91 for generating a write pulse of a voltage level of $\pm Ew$ (V) in response to a write data signal is connected to amplifier 83 via switch 92b and is grounded via switch 92d and attenuator resistors R1 to R3 of the same resistance. The other end of attenuator resistor R1 is grounded via switch 92c. Further, a W/R gate signal for selectively setting the read or write mode is supplied to switches 92b and 92d via amplifier 90 and to switches 92a and 92c via amplifier 90 and inverting amplifier 94.

In this circuit, when the W/R gate signal, read pulse and write pulse are generated at timings shown in FIG. 25, signals shown in FIG. 25 are derived from switch 92a or 92b and switch 92c or 92d. That is, when the read mode is selected by the W/R gate signal, switches 92a and 92c are set into the ON position and switches 92b and 92d are set into the OFF position. As a result, a read pulse of voltage level Er less than level EC from driver circuit 81 is output via switch 92a. In contrast, when the write mode is selected by the W/R gate signal, switches 92b and 92d are set into the ON position and switches 92a and 92c are set into the OFF position. As a result, a write pulse of voltage level $\pm Er$ from amplifier 91 is supplied to amplifier 83 via switch 92b and at the same time output via switch 92d. An output signal from switch 92d is attenuated by resistors R1, R2 and R3 and the amplitude thereof is attenuated to $\frac{2}{3}$ and $\frac{1}{3}$. Then, the attenuated signals are supplied to the stripe electrodes via impedance converters 93a and 93b and respective resistors R. In FIG. 24, switches 92a to 92d are set in the write mode positions.

FIG. 26 shows the equivalent circuit of a memory cell selected in the write mode. As is clearly seen from FIG. 26, the voltages attenuated by resistors R1 to R3 are applied to the respective stripe electrodes via impedance converters 93a and 93b and corresponding resistors R. In this case, voltages at nodes A to D in FIG. 26 are respectively set at $\pm \frac{2}{3}$Ew, $\pm \frac{1}{3}$Ew, $\pm$Ew and 0. As a result, voltages applied across resultant capacitors $C_X$, $C_Y$ and $C_{XY}$ are each set at $\pm \frac{1}{3}$Ew. Thus, data can be written into only a selected memory cell without influencing data stored in memory cells causing the crosstalk.

In this case, it is possible to connect switch 95 in shunt with feedback resistor Rf of output amplifier 82 and turn ON the switch so as to increase the feedback rate, thereby lowering the input impedance of the amplifier. As a result, a voltage at node D is set to be closer to 0 V, thereby causing a higher voltage to be applied across capacitor $C_L$. Thus, the write operation can be effected with higher reliability.

FIGS. 27 and 28 are circuit diagrams showing circuits which can suppress the input impedance of the output amplifier.

In FIG. 27, reference numeral 96 denotes a feedback type common-base amplifier whose input impedance is set to $R4/\alpha 2$, reference numerals 97a and 97b denote current sources in which currents of the same amount flow.

FIG. 28 is a circuit diagram in which current sources 97a and 97b are shown in more detail. Three transistors e, f and g are connected in a current mirror fashion in current source 97b and currents which are the same as a current flowing from current source h through transistor e respectively flow through transistors f and g. Further, two transistors m and n are also connected in a current mirror fashion in current source 97a, and a current which is the same as the above current flows in each of transistors m and n. That is, currents flowing in transistors g and n are equal to each other.

As described above, the input impedance can be suppressed by constructing output amplifier 82 as shown in FIG. 27 or 28, and the efficient and stable amplification can be attained.

When semiconductor switch 57 shown in FIG. 14 is used as the selection means and if the semiconductor switch is formed according to the ordinary semiconductor manufacturing process, the occupied area for each switch is approx. 10 $\mu m^2$. At this time, if the width and pitch of the stripe electrodes are set to be larger in compliance with the size of the semiconductor switch, the memory capacity for the unit area will be lowered. In a case where two switches are connected for each stripe electrode to prevent the crosstalk, a still larger area is required. When the semiconductor switches are arranged in parallel on the substrate, the area of the selection means for the area of the memory portion becomes larger and as a result the memory chip area becomes larger.

In the above embodiment, when data is read out from the memory, a non-destructive readout operation is effected in which a read pulse of electric field weaker than coercive electric field Ec is used to read out memory data without inverting the polarization direction. However, it is possible to effect a destructive readout operation in which an electric field exceeding inverted electric field Es and coercive electric field Ec is applied so as to read out memory data while inverting the polarization direction.

Now, the destructive readout operation is explained with reference to a hysteresis loop shown in FIG. 29. Assume that the polarization state of a memory cell set in the readout mode is set at point a. Under this condition, when electric field Er exceeding electric field Es is applied to the memory cell, the polarization state is transferred from point a to point b in a direction indicated by an arrow of the hysteresis loop. At this time, the polarization state is inverted at coercive electric field Ec and memory data can be read out by detecting variation in current caused at this time. Readout electric field Er can be applied by use of a pulse having an adequate pulse length. Even after readout electric field Er is removed, the polarization state is not returned to point a but returned to point c. In this way, the polarization states before and after the memory data readout operation are different from each other, that is, the original memory data is destroyed. In order to hold the memory content even after the readout operation, it is necessary to effect a re-writing operation by applying electric field $-$Er exceeding negative inverted electric field $-$Es so as to return the polarization state from point c to point a via point d.

In the destructive readout operation, variation in the polarization state is large and the rate of current variation becomes large in comparison with the non-destructive readout operation so that the memory content ca be correctly read out with high SN ratio.

Figure 29:
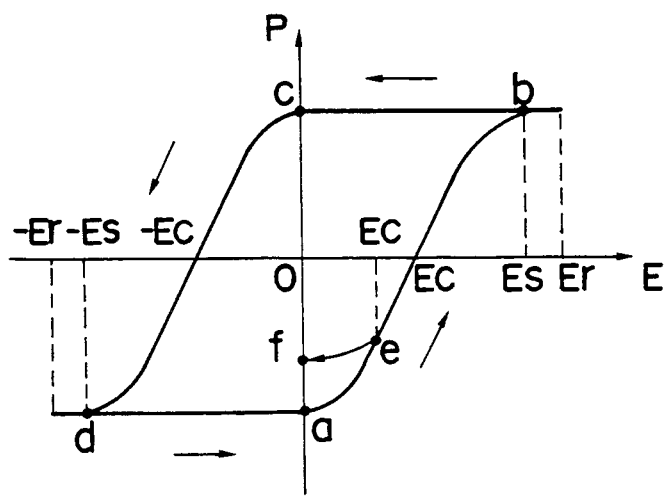

As shown in FIG. 29, if an electric field of a certain intensity (for example, more than Ec/2) is applied as the readout electric field in the non-destructive readout operation, the polarization state may sometimes be transferred from point a to point f at which the polarization value is small via point e instead of being returned to point a. In this case, the polarization value becomes smaller for each readout operation and the SN ratio becomes worse.

However, since an electric field exceeding inverted electric field $\pm$Es is applied in the destructive readout operation, the polarization state varies along the hysteresis loop and the polarization value can be kept unchanged. As a result, even if the readout operation is repeatedly effected, the SN ratio will not be lowered.

The destructive readout operation has a problem that crosstalk will be caused by a leak electric field applied to adjacent memory cell. In the above-described non-destructive readout operation, an electric field applied in the readout mode is weak and there occurs no problem of crosstalk. However, in the destructive readout operation which makes use of inversion of the polarization, an electric field which is as high as the electric field applied for writing is applied. Therefore, it is necessary to take measures so as to prevent crosstalk by reducing the leak electric field in the same manner as in the writing operation.

The crosstalk can be prevented by reducing the leak electric field in the non-destructive readout operation by taking the following measures. That is, as in the embodiment shown in FIGS. 24 to 26, an amplifier to which a gate signal for selectively setting the readout and writing modes is supplied, a comparison amplifier for generating a write pulse in response to a write data signal and a switch selectively set into the read or write state in response to the gate signal are used. In this case, the first and second stripe electrodes which have been connected to GND via low-resistance resistors are connected to GND via low-resistance resistors and impedance converters and voltages applied across combined capacitors $C_X$, $C_Y$ and $C_{XY}$ of an adjacent memory cell are set at Es/3.

Further, a method for preventing the crosstalk more effectively is explained in the following embodiment.

Figure 30:
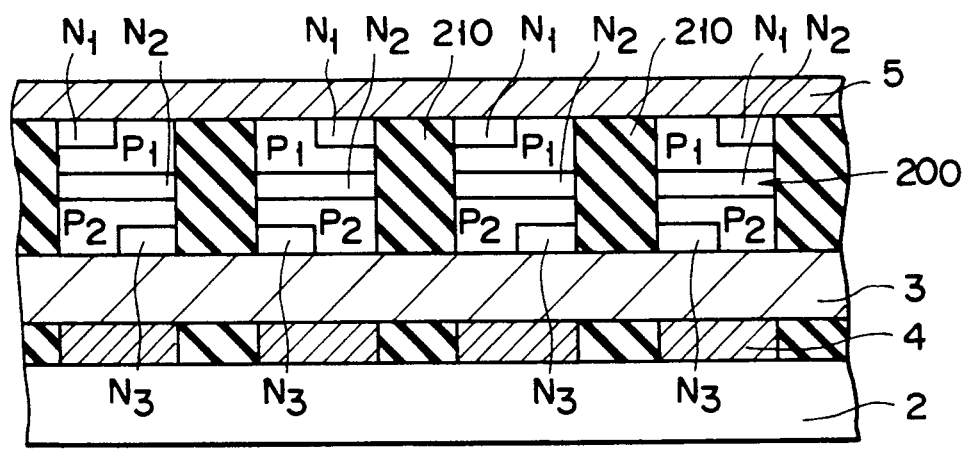
Figure 31:
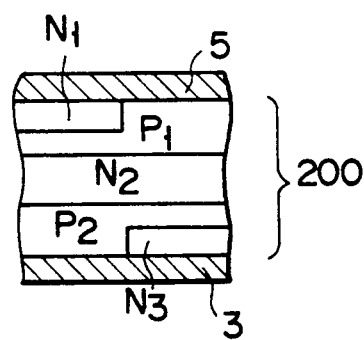
Figure 32:
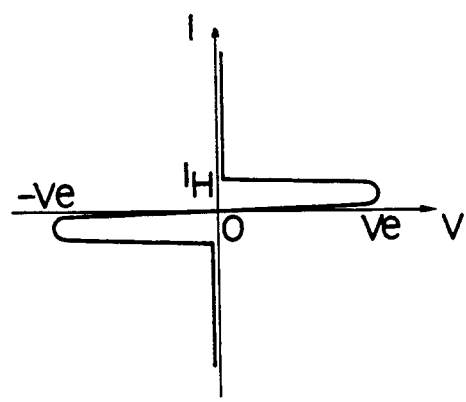

In this embodiment, as shown in FIG. 30, there are provided ferroelectric thin film 3 and semiconductor circuit portions 200 called diode AC switches (DIAC) or silicon symmetrical switches (SSS) disposed between first and second stripe electrodes 4 and 5 which are arranged to hold ferroelectric thin film 3 therebetween. Semiconductor circuit portions 200 are isolated from one another by insulation layers 210 and each of the semiconductor circuit portions is formed of five laminated semiconductor layers N1, P1, N2, P2 and N3 which are disposed on ferroelectric thin film 3 so as to be connected in series for each memory cell. FIG. 31 is a cross sectional view of a DIAC formed as semiconductor circuit portion 200 and held between a pair of electrodes and FIG. 32 is a diagram showing the voltage-current characteristic of the DIAC for illustrating the operation of the DIAC. As shown in FIG. 31, two sets of four-layered diodes which are symmetrical with respect to the central line of the DIAC are arranged in inverse-parallel fashion. Further, as shown in FIG. 32, the voltage-current characteristic has the four-layered diode characteristic in both directions. That is, the DIAC is kept in the OFF state in which no current flows and acts as a high-resistance element when a voltage which does not exceed voltage ±Ve is applied, and is set in the ON state in which current is permitted to freely flow and acts as a conductive element when a voltage which exceeds voltage ±Ve is applied. Current $I_H$ flowing at this time is called a holding current and can be controlled by changing the thickness of second n-type layer $N_2$ or the carrier concentration ratios of first p-type layer $P_1$/first n-type layer $N_1$ and $N_2/P_2$. The resistance of ferroelectric thin film 3 is of the order of MΩ, and when a voltage applied in the write-in and readout modes is set to 5 to 10 V, only several μA can flow in ferroelectric thin film 3 and $I_H$ is designed to be lower than the above current.

Now, the operation of the embodiment shown in FIG. 30 is explained. When data is read out from (or written into) a selected memory cell in a destructive readout fashion, it is necessary to apply electric field Er exceeding inverted electric field Es and coercive electric field Ec in the ferroelectric thin film. At this time, the following relation can be obtained in the hysteresis loop shown in FIG. 29.

$$Er > Es > Ec \tag{1}$$

In this case, the polarization state of a memory cell to which electric field Er is applied is inverted from point a to point c, for example, and polarization value Pr can be kept unchanged according to the hysteresis loop even after electric field Er is removed.

Then, voltage $V_1$ is applied between stripe electrodes 4 and 5. At this time, $V_1$ is set to satisfy the following relation.

$$V_1 \geq Ve \tag{2}$$

Under this condition, semiconductor circuit portion 200 of the memory cell which is applied with $V_1$ is set in the ON state so as to act as a conductive element, thereby permitting voltage $V_1$ to be directly applied to ferroelectric thin film 3. At this time, electric field Ef is obtained as follows:

$$Ef = V_1/d_1 \tag{3}$$

where $d_1$ denotes the thickness of ferroelectric thin film 3. In this case, if Ef=Er, the polarization can be inverted. At this time, a leak voltage applied to the adjacent memory cell is $V_2$ (<Ve) which is lower than $V_1$. Therefore, in order to set semiconductor circuit portion 200 into the OFF state and operates the same as a high-resistance element, it is necessary to set the following relation.

$$V_1 \geq Ve > V_2 \tag{4}$$

Leak voltage $V_2$ depends on the pitch between the electrodes, but is generally set lower than a fraction of $V_1$.

Leak electric field Eg caused by leak voltage $V_2$ can be expressed as follows when a distance (that is, the sum of film thickness $d_1$ and the thickness of the DIAC acting as semiconductor circuit portion 200) between first and second stripe electrodes 4 and 5 is $d_2$.

$$Eg = V_2/d_2 \tag{5}$$

In this case, $V_2$ is equal to leak voltage $V_3$ which is applied to the adjacent memory cell when semiconductor circuit portion 200 is not provided, and the following equations are obtained.

$$V_3 = Ed \cdot d_1 \tag{6}$$

$$V_3 = V_2 \tag{7}$$

The following equation can be derived based on equations (5) to (7):

$$Eg = Ed \cdot d_1/d_2 \tag{8}$$

Since $d_1/d_2 < 1$, the following relation can be obtained:

$$Eg < Ed \tag{9}$$

As described above, with semiconductor circuit portion 200, a leak electric field applied to the adjacent memory cell can be reduced, thus making it possible to prevent the crosstalk.

Further, Eg can be reduced to $Z_1/(Z_1+Z_2)$ of its initial value by setting resistance $Z_2$ of semiconductor circuit portion 200 relatively larger than resistance $Z_1$ of ferroelectric thin film 3, thereby preventing the crosstalk more effectively. Now, an example of a method of manufacturing the device of this embodiment is explained with reference to FIGS. 33A to 33D.

Figure 33A:
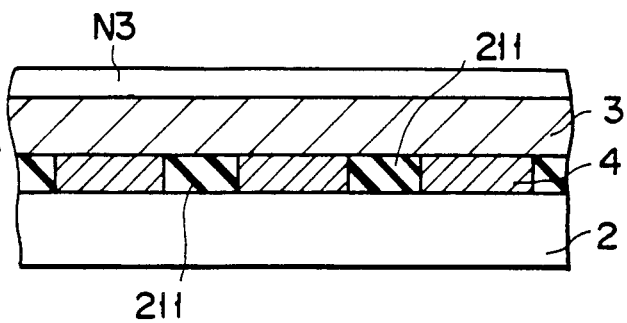
FIGS. 33A to 33D are views showing steps of a method for manufacturing the memory shown in FIG. 30.

First, stripe electrodes 4 are formed in a lattice configuration on substrate 2 and insulation layers 210 are disposed between the stripe electrodes to level the surface. Then, ferroelectric thin film 3 and layer N3 are sequentially laminated (FIG. 33A).

Figure 33B:
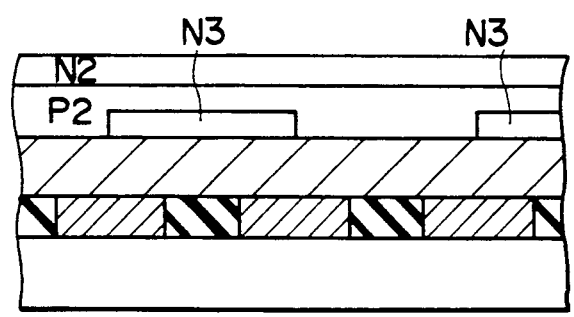

Layer N3 is etched out by use of a photoresist, for example, and divided into a plural portions such that each divided portion may lie over two adjacent stripe electrodes and each end of the divided portion may lie directly over the center of a corresponding one of the stripe electrodes. Then, layers P2 and N2 are sequentially laminated (FIG. 33B).

Figure 33C:
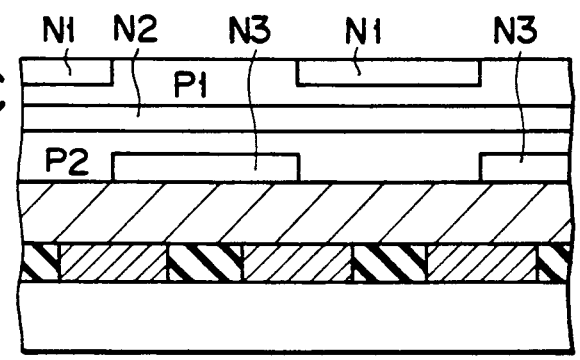
Figure 33D:
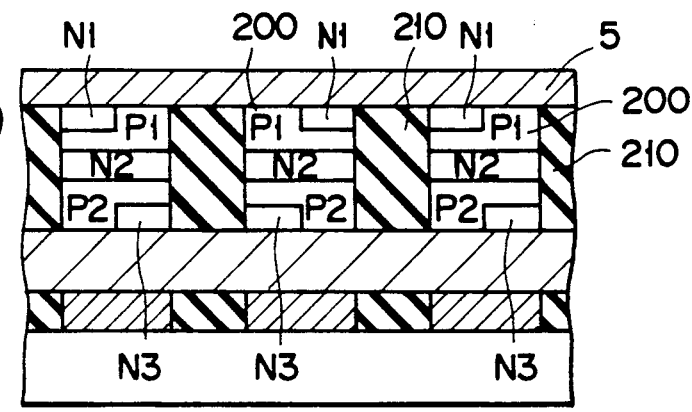

After layer P1 is disposed on layer N2, layer N1 is formed in layer P1 by the ion-implantation technique. At this time, layer N1 is formed in a symmetrical position with layer N3 (FIG. 33C).

Then, the laminated semiconductors are etched to the surface of ferroelectric thin film 3 by an RIE method using a resist as a mask so as to discretely form circuit portions 200 for each memory cell. After the resist is removed, insulation layers 210 are formed to level the surface and stripe electrodes 5 are formed, thus competing the process of forming the memory.

Figure 34:
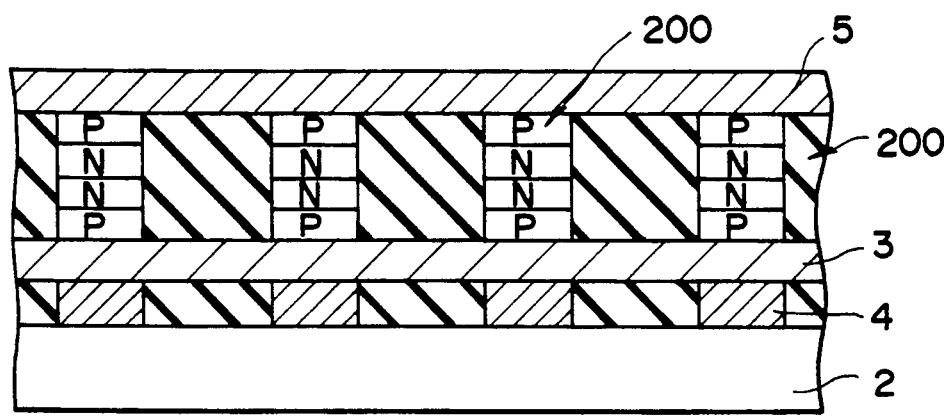
Figure 35:
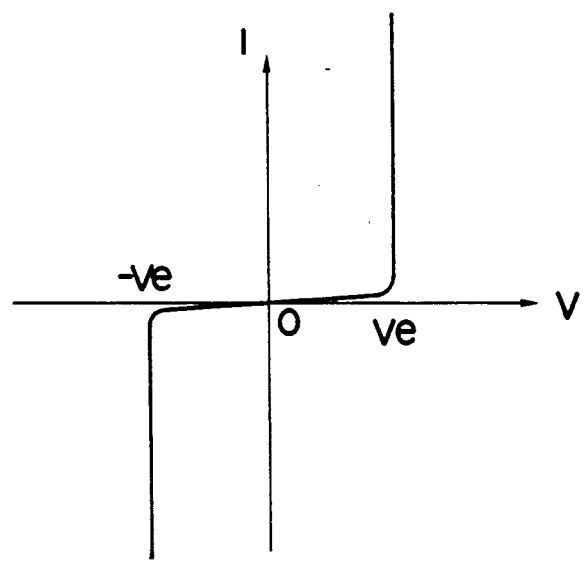

In the above embodiment, a DIAC is used as semiconductor circuit portion 200. However, the same effect can be obtained when a four-layered PNPN structure formed by connecting two diode elements in inverse-parallel fashion as shown in FIG. 34 is used. The voltage-current characteristic of the element is shown in FIG. 35, and the element has resistance Z3 expressed as follows when the element is set in the ON state in which a voltage higher than Ve is applied.

$$Z_3 = Ve/Id \qquad (10)$$

Therefore, electric field Ef' applied to ferroelectric thin film 3 of a selected memory cell can be derived as follows based on equation (3).

$$Ef' = (V_1/d_1)(Z_1/(Z_1+Z_3)) \qquad (11)$$

Assuming that resistance $Z_1$ in the OFF state is not changed, leak electric field Eg' applied to the adjacent memory cell is obtained as follows in the same manner as in equation (8).

$$Eg' = Ed \cdot d_1/d_2 \qquad (12)$$

Under this condition, electric field Ef' applied to a selected memory cell becomes weaker than Ef in the above DIAC. However, since resistance $Z_4$ in the OFF state of the semiconductor circuit portion is larger than $Z_3$, the leak electric field applied to the adjacent memory cell can be reduced and the crosstalk can be effectively prevented in comparison with a case wherein no semiconductor circuit portion is provided.

In the above embodiments, ferroelectric thin film 3 is integrally formed without being etched. However, like semiconductor circuit portions 200, it can be etched and divided into a plural portions and insulation layers are disposed so that the ferroelectric thin film portions can be separately formed for each memory cell.

Now, an embodiment of ferroelectric memory 1 in which semiconductor switches are used as the selection means is explained. FIG. 36 is an exploded perspective view of the ferroelectric memory according to this embodiment and FIG. 37 is a plan view showing an example of a drive cell layer.

For simplifying the explanation, the memory shown in FIGS. 36 and 37 is formed as a 625-bit memory having drive cells arranged in an array of 5 rows×5 columns.

As shown in FIG. 37, in this embodiment, drive cell layer 121 is formed of drive cells 120 which are arranged in a matrix form (5 rows×5 columns in this example) in the same plane and in which semiconductor switches connected to respective stripe electrodes to selectively connect the stripe electrodes to the common electrode are arranged. As shown in FIG. 36, drive cell layer 121a connected to first electrode assembly 4, first electrode assembly 4, ferroelectric thin film 3, second electrode assembly 5 and drive cell layer 121b connected to second electrode assembly 5 are laminated on substrate 2 in this order. In practice, insulation films 122 are formed between stripe electrodes and between each drive cell layer and the stripe electrodes, and the cross section of FIG. 38 is obtained as that of the memory.

In this embodiment, the drive cells are formed with the same pattern, and contact portion 120a between each drive cell 120 and the stripe electrode is set in the same position (left upper corner in FIG. 30) in each driving cell. The drive cells in each row are shifted by one pitch of the stripe electrodes with respect to the drive cells in the adjacent row. With this arrangement, the drive cells can be formed with high density and as a result the effects of increasing the number of memory cells (high density), simplifying the mask pattern design for the semiconductor manufacturing, enhancing the process efficiency and the like can be attained.

It is also possible to constitute drive cell 120 by use of a terminal portion and a switching portion as shown in FIG. 39, and set contact portions 120a in contact with the stripe electrodes in positions which are set on the respective terminal portions and shifted on different rows.

A method of manufacturing the ferroelectric memory of this embodiment is explained below. FIGS. 40A to 40J are views illustrating an example of the method for manufacturing the ferroelectric memory using the drive cell layers.

Figure 40A:
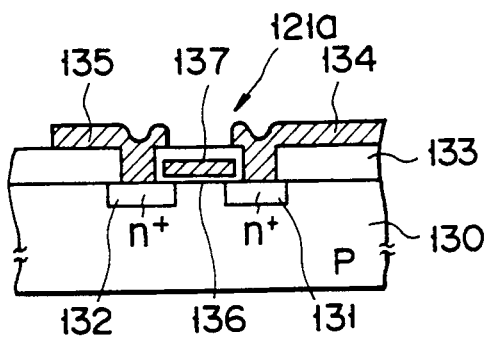

First, MOSFETs are formed as first drive cell layer 121a on Si substrate 130 by a well known semiconductor process. As is understood from FIG. 40A, impurities are ion-implanted into Si substrate 130 to form source diffusion layer 131 and drain diffusion layer 132. Field oxide film 133 which is partly removed is formed on Si substrate 130, source electrode 134 and drain electrode 135 are formed on insulation film 133 so as to be in contact with source and drain diffusion layers 131 and 132, respectively, and gate electrode 137 which is covered with gate oxide film 136 is formed between the source and drain electrodes. Gate electrode 137 is formed to extend above and between the end portions of source and drain diffusion layers 131 and 132. Source and drain electrodes 134 and 135 are formed of material which is resistant to heat generated in the later heat treatment, for example, refractory metal such as Mo, W, Ti or the silicide thereof ($MoSi_2$, $WSi_2$, $TiSi_2$) Gate electrode 137 is formed of polysilicon or the above silicide (FIG. 40A).

Figure 40B:
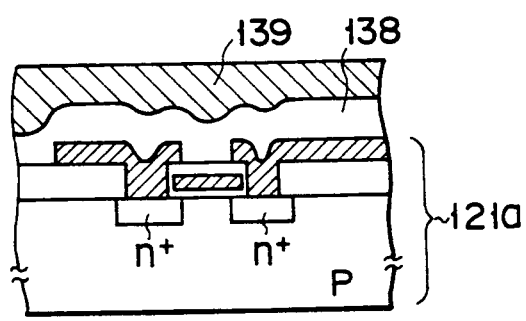

The upper surface of MOSFET 121a is covered with insulation film 138 of 0.5 to 5 μm thickness. Insulation film 138 is formed of $SiO_2$ or PSG (phospho-silicate glass) which is formed by the atmospheric pressure CVD (AP CVD), low pressure CVD (LP CVD) or plasma CVD (P CVD). Resist 139 is coated on insulation film 138 (FIG. 40B). Then, parts of resist 139 and insulation film 138 are removed by the back-sputtering or RIE etching-back technique to make the upper surface of the insulation film flat.

Figure 40C:
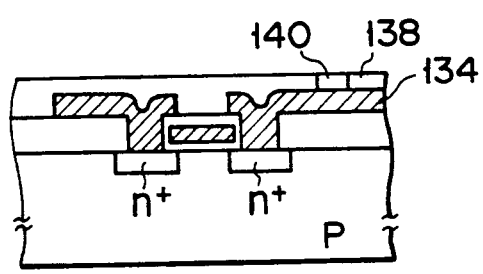

As shown in FIG. 40C, contact hole 140 is formed by, for example, a well known photoetching process in that portion of insulation film 138 which corresponds to a contact portion of source electrode 134 electrically connected to first electrode assembly 4 to be formed on the flat surface of insulation film 138.

Figure 40D:
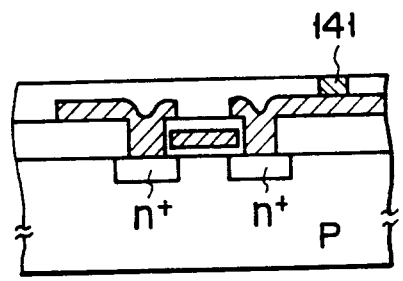

Electrically conductive material such as metal is disposed to fill contact hole 140, thus forming contact 141. In order to fill the metal in contact hole 140, selective CVD technique using W (tungsten) is utilized (FIG. 40D).

Figure 40E:
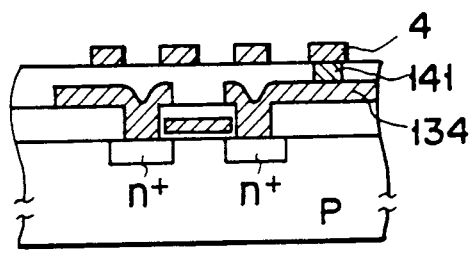

As shown in FIG. 40E, electrode metal is formed to a thickness of 0.1 to 1.0 μm on the upper surface of insulation film 138 and is selectively etched in the stripe form by the photoetching technique so as to form electrode assembly 4 having a plurality of stripe electrodes. Refractory metal or the silicide thereof may be used as the electrode metal. Further, doped polysilicon in which impurity such as phosphorus is heavily doped can also be used. One of the stripe electrodes of first electrode assembly 4 is connected to source electrode 134 of MOSFET 121a via contact 141.

Figure 40F:
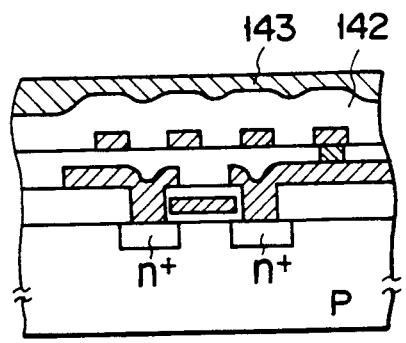

Next, as shown in FIG. 40F, insulation film 142 of SiO$_2$ or PSG formed in the same manner as shown in FIG. 33B and resist 143 are formed on the surface of the semiconductor structure having first electrode assembly 4 formed in the preceding step.

Figure 40G:
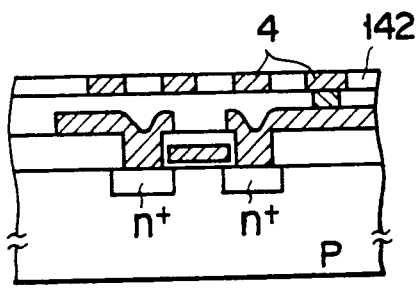

After this, as shown in FIG. 40G, resist 143 and insulation film 142 are smoothly etched by the back-sputtering or RIE etching-back technique until the upper surface of electrode assembly 4 is reached, thus making the upper surface of the semiconductor structure flat.

Figure 40H:
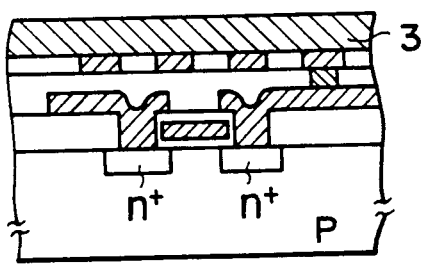

Then, as shown in FIG. 40H, ferroelectric thin film 3 formed of PTZ, for example, with a desired thickness is formed on the flat surface of the semiconductor structure. The method of forming the film is effected by use of the ion sputtering method, RF magnetron sputtering method, electron beam deposition method, cluster ion beam method, MOCVD method or the like. For example, it is preferable to use the multi-ion beam sputtering method in order to control the composition of the thin film when a multi-element oxide thin film of PZT, PLZT or the like is formed. After this, the heat treatment may be effected at temperatures higher than 600° C. in order to crystallize ferroelectric thin film 3.

Figure 40I:
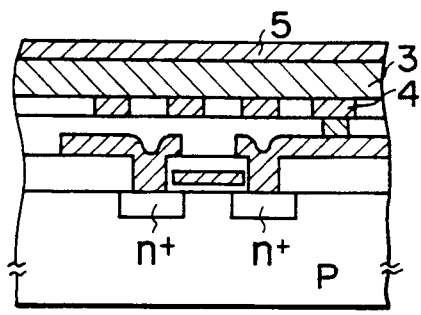
Figure 40M:
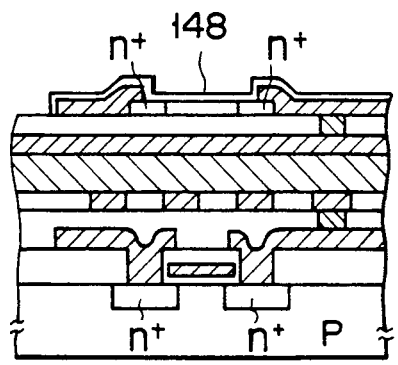

Next, as shown in FIG. 40I, electrode conductive material is formed to a thickness of 0.1 to 1.0 μm on the upper surface of ferroelectric thin film 3 and is selectively etched by the photoetching so as to form second electrode assembly 5 having a plurality of stripe electrodes which intersect the stripe electrodes of first electrode assembly 4. The same electrode material as is used in the step of FIG. 40E is used in this step.

Figure 40J:
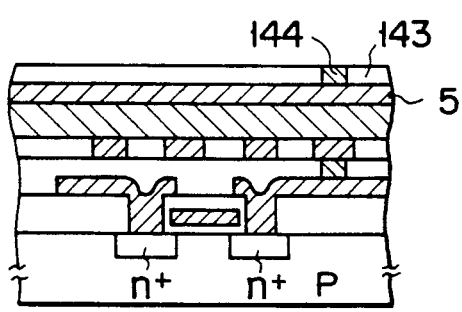
Figure 40N:
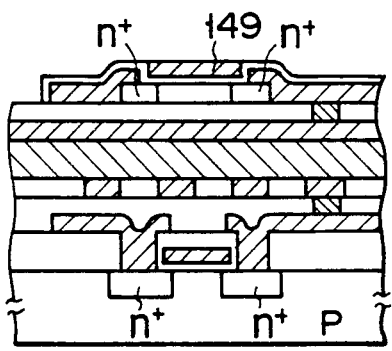

Insulation film 143 is formed with a thickness of 0.5 to 5 μm to cover second electrode assembly 5 and is made flat in the same manner as in the steps of FIGS. 40B and 40F. Then, as shown in FIG. 40J, contact 144 is formed in insulation film 143 in the same manner as in the steps shown in FIGS. 40C and 40D.

Figure 40K:
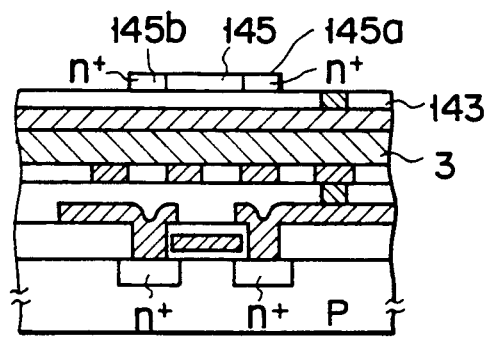
Figure 40O:
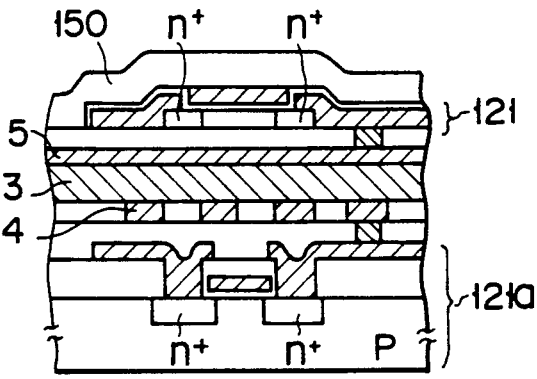

Next, a silicon film formed of polysilicon or amorphous silicon is formed with a thickness of 0.1 to 1.0 μm on the upper surface of insulation film 143 by the LP CVD method, P CVD method, electron beam deposition method, sputtering method, or the like. Then, the heat treatment is effected to form crystallized silicon film 145. The method of obtaining crystallized silicon film 145 may be attained by effecting the annealing process at a high temperature of approx. 600° C. or applying an electron beam or ultraviolet laser beam to the polysilicon or amorphous silicon for a brief period of time (less than 1 nsec) to raise the temperature thereof close to the melting point of silicon. After the silicon crystallization, the silicon film except that portion in which planar TFTs (thin film transistors) used as the second drive cells are to be formed is removed by the photoetching process and a channel doping process (low impurity concentration ion-implanting process) for controlling the threshold voltage of the TFT is effected. Then, impurity such as As or P is ion-implanted into portions of the silicon film to form n$^+$-type diffusion layers 145a and 145b which are to be connected to the source and drain electrodes of the TFT. At this time, the annealing process is effected at temperature higher than 600° C. to activate the ion-implanted impurity. The thermal annealing process can also be used to anneal ferroelectric thin film 3 for crystallization (FIG. 40K).

Figure 40L:
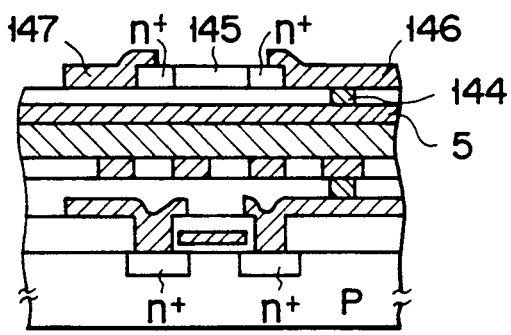

A conductive film of Al, SlSi, AlSiCu or the like is formed to a thickness of 0.1 to 1.0 μm on silicon film 145 and insulation film 143 by the sputtering method, electron beam deposition method or the like. Then, the conductive film is selectively removed by the photoetching process to form source electrode 146 and drain electrode 147. Source electrode 146 and drain electrode 147 are respectively connected to n$^+$-type diffusion layers 145a and 145b. Further, source electrode 146 is connected to second electrode assembly 5 via contact 144 (FIG. 40L).

An insulation film used for forming the gate insulation film of the TFT is formed by the CVD method and selectively removed by the photoetching process to form gate insulation film 148 as shown in FIG. 33M. Insulation film 148 may be formed of Si$_3$N$_4$, SiO, Ta$_2$O$_5$ or the like.

A conductive film formed of Al, AlSi, AlSiCu or the like is deposited to a thickness of 0.1 to 1.0 μm on insulation film 148 by the sputtering method, electron beam deposition method, for example. The conductive film is selectively removed by the photoetching process to form gate electrode 149, thus attaining a device having drive cell layers 121a and 121b as shown in FIG. 33N. In this case, gate electrode 149, source electrode 146 and drain electrode 147 are formed of Al or Al alloy, but can be formed of material used in the step of FIG. 40A.

If required, it is possible to form passivation film 150 of Si$_3$N$_4$, PSG or the like on the surface of the TFT as shown in FIG. 40D.

In this way, a ferroelectric memory having the drive cell layers can be completed according to the above-described method.

In the above-described method of manufacturing the ferroelectric memory, the drive cell layer, first electrode assembly, ferroelectric thin film, second electrode assembly and drive cell layer are formed on the Si substrate in this order. However, in order to enhance the crystal quality of the ferroelectric thin film, it is possible to first form a ferroelectric thin film on, for example, a Si monocrystalline substrate, form a first electrode assembly, a first drive cell layer and a supporting plate on the upper surface of the ferroelectric thin film, remove the monocrystalline substrate, and then form a second electrode assembly and a second drive cell layer. Further, it is possible to form a single-layered o multi-layered thin film of material such as MgO which is similar in the crystal symmetrical property and lattice constant to the ferroelectric thin film before the ferroelectric thin film is formed. In this case, the crystallinity and orientation effect of the ferroelectric thin film can be enhanced.

Further, in this embodiment, drive cell layers 121a and 121b are respectively provided for first and second electrode assemblies 4 and 5. It is also possible to form a single-layered drive cell layer 121 having driving cells 122 for the first electrode assembly and driving cells 123 for the second electrode assembly which are alternately arranged in the row and column directions as shown in FIGS. 41 and 42. With this arrangement, the memory cell density or the memory capacity for unit area will be reduced, but entire drive cell layer 121 can be formed by one process, reducing the number of the manufacturing steps.

In the above embodiment, since the substrate is formed of Si, first drive cell layer 121a is formed of MOSFETs. However, when the substrate is formed of other material such as glass, first drive cell layer 121a can be formed of TFTs as in second drive cell layer 121b. Further, in the above embodiment, the manufacturing process is explained assuming that planar type TFT is used. However, it is also possible to use other type TFTs shown in FIGS. 43A to 43C. That is, FIGS. 36a to 36C show reverse planar type, stagger type and reverse stagger type TFTs, respectively. In FIGS. 43A to 43C, the same reference numerals are attached to the portions similar to those of the planar type TFT shown in FIGS. 40A to 40D.

Next, the drive cell layer is explained in more detail.

Figure 44:
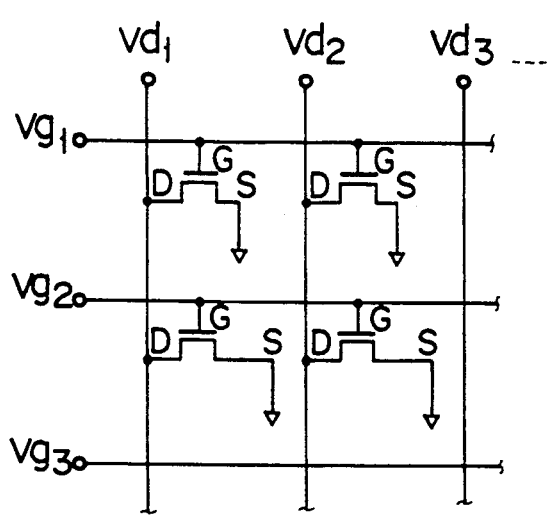

FIG. 44 is a connection diagram of part of the drive cell layer in a case where a MOS transistor is used as the semiconductor switch.

Figure 45:
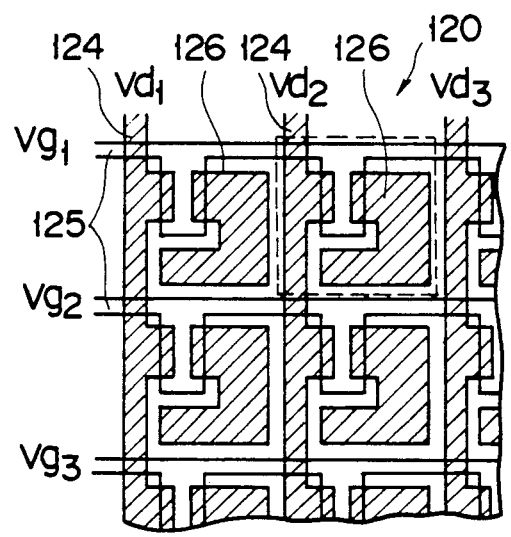
Figure 46:
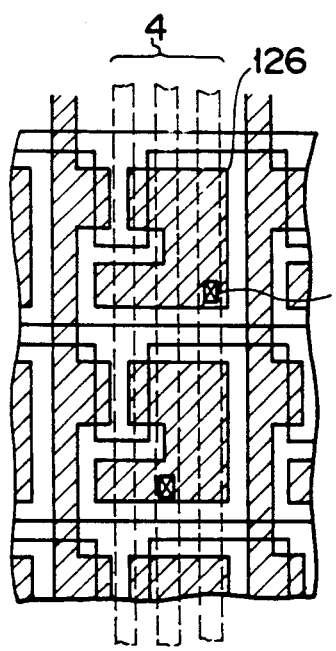
Figure 47:
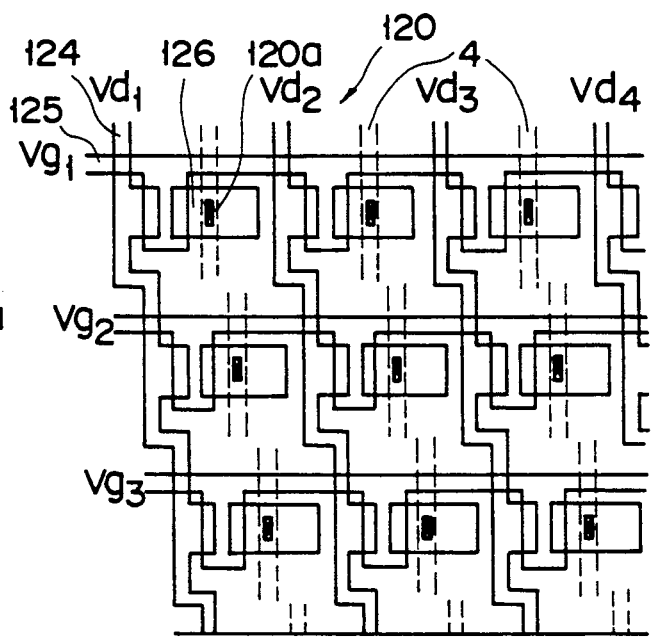

As is seen from FIG. 44, drain electrodes D of those of transistors arranged in a matrix form which lie on the same column are connected to a corresponding common terminal Vdi (i=1, 2,—) and gate electrodes dG of the transistors lying on the same row are connected to a corresponding common terminal Vgi (i=1, 2,—). Terminals for source electrodes S are independently provided for each drive cell. Drain electrode terminals Vdi, gate electrode terminals Vgi and source electrodes are respectively connected to common electrode 6, control section 58 and electrode assembly 60 shown in FIG. 14. FIG. 45 is a view showing part of the drive cell layer of the ferroelectric memory formed as described above. As shown in FIG. 38, drain electrodes 124 formed in parallel extend in a column direction and gate electrodes 125 formed in parallel to extend in a row direction are arranged to intersect each other. Source electrodes 126 are formed in areas which are defined by drain electrodes 124 and gate electrodes 125 and arranged in a matrix form. In FIG. 45, portion surrounded by broken lines indicates drive cell 120, and in this embodiment, the drive cell is formed of a single switch. As shown in FIG. 46, each source electrode 126 is formed in the shape of "reversed C" increase the effective area so that the stripe electrodes can be connected to the source electrodes via contact portions 120a which are formed on the respective source electrodes in positions shifted in a row direction while the drive cells are kept aligned. In contrast, in FIG. 47, drive cells 120 in each row are shifted by one pitch of the stripe electrodes of electrode assembly 4 with respect to the drive cells in the adjacent row. If the drive cells are shifted and connected to the stripe electrodes in this way, it is not necessary to increase the area of the source electrode and the source electrode may be formed in a rectangular form as shown in FIG. 47, for example.

Next, an embodiment in which the semiconductor switch is formed of the CMOS transistor shown in FIG. 23 is explained.

FIG. 48 is a plan view of a CMOS transistor. In order to form CMOS transistors including four transistors Tr1 to Tr4 on the same substrate, the positions of transistors Tr3 and Tr4 in FIG. 23 are reversed in FIG. 48. Common drain diffusion layer 162 of transistors Tr1 and Tr3 is formed between source diffusion layers 160 and 161 of respective transistors Tr1 and Tr3. Source diffusion layers 163 and 164 of transistors Tr2 and Tr4 and common drain diffusion layer 165 of transistors Tr2 and Tr4 are arranged symmetrically with respect to source diffusion layers 160 and 161 and common drain diffusion layer 162. Gate electrode 16 of transistor Tr1 is formed above and between source diffusion layer 160 of transistor Tr1 and common drain diffusion layer 162 of transistor Tr1 and Tr3. Likewise, gate electrodes 167, 168 and 169 are each formed above and between a corresponding one of the source diffusion layers and a corresponding one of the common drain diffusion layers. In this case, gate electrodes 167 and 168 of transistors Tr2 and Tr3 are connected to each other and formed of a single conductive layer. Further, source diffusion layer 160 of transistor Tr1 and source diffusion layer 163 of transistor Tr2 are connected to each other by means of "T"-shaped Vin electrode 170. Also, source electrodes 161 and 164 of transistors Tr3 and Tr4 and common drain diffusion layers 162 and 165 are connected to one another by means of "H"-spaped Vout electrode 171. Vin electrode 170 and Vout electrode 171 are respectively connected to common electrode 6 (7) and electrode assembly 4 (5) shown in FIG. 14. Gate electrodes 166, 169 of transistors Tr1, Tr4 and gate electrodes 167, 168 of transistors Tr2, Tr3 which are integrally formed are connected to control section 58 of FIG. 14 so that the formed electrodes can be supplied with a signal in inverted relation with respect to a signal supplied to the latter electrodes. FIGS. 49A and 49B are sectional views taken along lines 42A—42A and 42B—42B of FIG. 48. As shown in FIGS. 49a and 49B, p-well diffusion layer 173 is formed in the surface area of n-type substrate 172 in the area of transistors Tr2 and tr4, and n+-type diffusion layers 163, 164 and 165 are formed in the surface area of p-well diffusion layer 173. In the area of transistors Tr1 and Tr3, p+-type source and drain diffusion layers 160, 161 and 162 are formed in the surface area of n-type substrate 172. FIG. 50 shows a connection diagram in a case where the drive cells in each row are shifted with respect to the drive cells in the adjacent row. As is seen from FIG. 50, Vin electrodes 170 on the same column are connected to common terminal Vi (i=1, 2,—), the gate electrodes of transistors Tr1 and tr4 on the same row are connected to respective common terminals Gi and Gi+1, and the common gate electrodes of transistors Tr2 and Tr3 on the same row are connected to common terminal Gi. Further, Vout terminal are independently formed for each drive cell, and terminal V1 is connected to common electrode 6 and terminals Gi, Gi+1 and Gi are connected to control section 58.

In a case where drive cell 120 surrounded by broken lines is selected in the circuit of this embodiment, signals in inverted relation are supplied to terminals G1, G2 and terminal G1 and at the same time a signal is supplied to terminal V1 selected by means of a selection circuit (not shown).

In the above examples, the gate electrodes are connected together via a plurality of switches and the drain electrodes are also connected together via a plurality of switches, and it is necessary to selectively turn ON and OFF the switches by supplying gate pulses thereto. It is further necessary to provide a drain electrode selection circuit (not shown) between the common electrode and drain electrode terminal Vdi in order to select the drain electrode to which a read pulse or write pulse is supplied.

Figure 51:
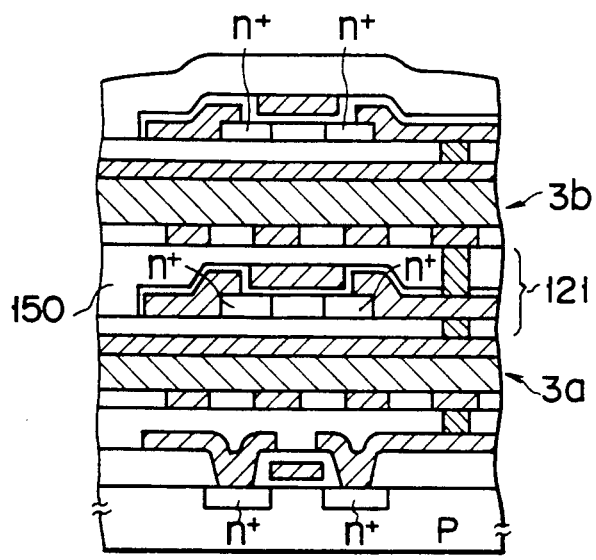
Figure 52:
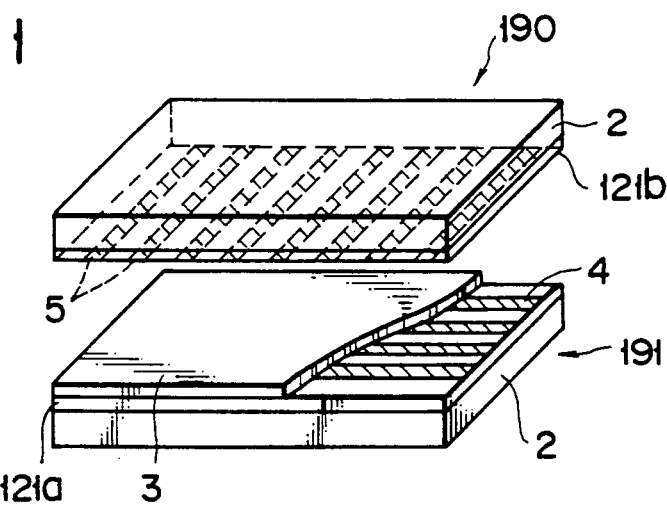
Figure 53:
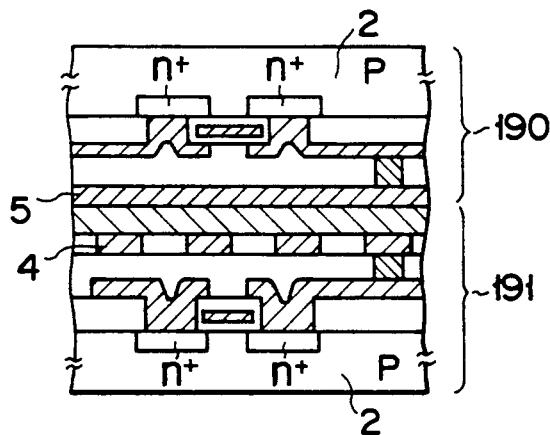

In the embodiment using the drive cell layer, the memory is formed to have single ferroelectric thin film 1. However, it is possible to form a laminated type ferroelectric memory by laminating the ferroelectric thin films. In this case, in order that the laminated by type ferroelectric memory is formed to have drive cell layer or layers, passivation film 150 formed in the step of FIG. 40D is made flat, and then the process of FIGS. 40C to 40D is repeatedly effected. FIG. 51 shows an example of the laminated type ferroelectric memory according to the above-described method. In FIG. 51, cell layer 121 is commonly used for two laminated ferroelectric thin films 3a and 3b. However, it is also possible to dispose two drive cell layers separately for the respective ferroelectric thin films.

In the manufacturing method shown in FIGS. 40A to 40D, the drive cell layer, electrode assembly, ferroelectric think film, electrode assembly and drive cell layer are disposed on the substrate in this order. However, it is also possible to separately form elements shown in FIGS. 40g and 40h, that is, element 190 having drive cell layer 121b and electrode assembly 5 disposed on substrate 2 and element 191 having drive cell layer 121z, electrode assembly 4 and ferroelectric thin film 3 disposed on substrate 2 in this order, and then bond elements 190 and 191 together with the stripe electrodes of electrode assemblies 4 and 5 intersect each other. Thus, a single-layered ferroelectric memory can be obtained. In this way, the manufacturing process of the ferroelectric memory can be simplified and the mass productivity can be enhanced.

This invention is not limited to the above embodiments, and can be variously modified.

For example, the first and second electrode assemblies are arranged with the ferroelectric thin film disposed therebetween in the above embodiments, and the polarization direction is set to be the same as the direction of lamination (vertical direction in the drawing). However, the polarization direction can be set to be perpendicular (lateral direction in the drawing) to the lamination direction. FIGS. 54A and 54B shown an embodiment in which the polarization direction is set to be the lateral direction. FIG. 54A shows a ferroelectric memory in which a plurality of holes are formed in ferroelectric think film 3 which is formed on substrate 2, and the stripe electrodes of electrode assemblies 4 and 5 are alternately disposed in the holes so that portions of ferroelectric thin film 3 can be disposed between the respective stripe electrodes of first and second electrode assemblies 4 and 5. Thus, the polarization direction is set as shown by arrows in FIGS. 54A and 54B. With this construction, since the ferroelectric thin film is formed not on the electrode assembly but directly on the substrate, a ferroelectric think film which is excellent in its crystallinity, orientation effect and polarization property by using a monocrystalline substrate which is similar in the crystallinity and lattice constant to the ferroelectric think film. FIG. 54B shows a ferroelectric memory in which the stripe electrodes of first and second electrode assemblies 4 and 5 are formed on one surface of ferroelectric think film 3 which is formed on substrate 2 and intersect at right angles with each other with an insulation film disposed therebetween. With this construction, the polarization of ferroelectric thin film 3 disposed between first and second electrode assemblies 4 and 5 is set as shown by arrow in FIG. 54B. Also, in thus embodiment, the ferroelectric thin film is directly formed on the substrate as in the former embodiment, and therefore a thin film having better crystallinity can be attained. Since, in this case, since it is not necessary to subject the ferroelectric thin film to a process such as an etching process, the crystallinity of the thin film will not be disturbed, thus making it possible to attain a high quality memory film.

Further, in the above embodiments, each of ferroelectric thin film 3 and first and second electrode assemblies 4 and 5 is disposed in a plane. However, as shown in FIG. 55, it is possible to form first electrode assembly 4 and ferroelectric thin film 3 with recess portions and form second electrode assembly 5 in and on the recess portions. With this construction, the effective area of the opposing electrodes of a memory cell becomes large, increasing the static capacitance. As a result, the S/N ratio for the signal is enhanced and the readout operation can be simplified.

Further, it is possible to provide a plurality of common electrodes 8 and 9 for respective first and second electrode assemblies 4 and 5 as shown in FIG. 56. In FIG. 56, three common electrodes 8, 9 are provided, and every three stripe electrode of each electrode assembly are connected to a corresponding one of the three common electrodes. In this case, insulation film 65 is formed between common electrodes 8, 9 and stripe electrodes of electrode assemblies 4 and 5 which are not electrically connected. In this way, if a plurality of common electrodes are provided, data can be read out or written into a single-layered ferroelectric memory in parallel.

Figure 57:
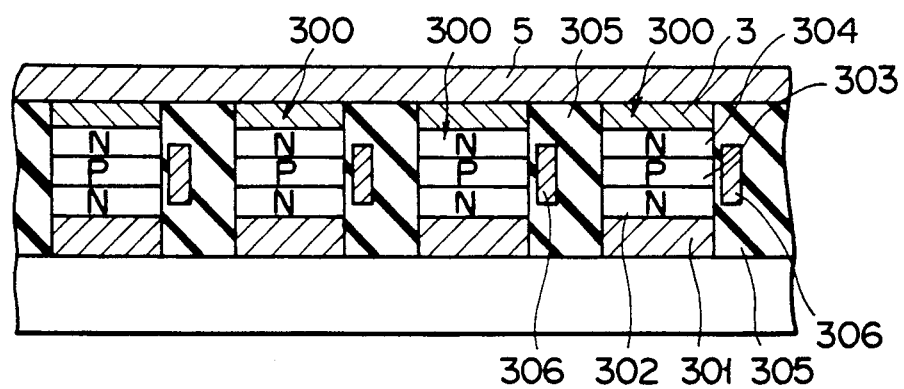
FIG. 57 is a view showing a memory device of other embodiment of the present invention.

Further, in the above embodiment, the integration density is enhanced by displacing the intersections between the drive cells and stripe electrodes of the drive cell layer formed in a flat configuration. However, it is possible to form the drive cells with a vertical structure for each memory cell. FIG. 57 shows an embodiment in which vertical FETs 300 are formed as the drive cells. Specifically, n-type layers 302, p-type layers 303 and n-type layers 304 are sequentially formed on respective drain electrodes 301, gate electrodes 306 are formed on the respective side surfaces of the laminated structures through insulation layers 305 to constitute vertical FETs 300, and ferroelectric thin films 3 and stripe electrodes 5 are sequentially formed on respective n-type layers 304 of vertical FETs 300.

As described above, the area of each drive cell can be reduced and the integration density can be enhanced by constituting the drive cell layer by vertical FETs.

As described above, according to this invention, there can be provided a small and thin ferroelectric memory and methods for driving and manufacturing the same in which the information storing position of a ferroelectric memory can be specified to simplify the position controlling for the storing and reading operations and information can be stored and read out at a high speed.

Further, there can be provided a laminated type ferroelectric memory and methods for driving and manufacturing the laminated type ferroelectric memory which is formed by laminating a plurality of ferroelectric memories to have a large memory capacity and in which information can be stored and read out.

Also, there can be provided a novel memory card formed with a ferroelectric memory and having a significantly enlarged memory capacity.

What is claimed is:

1. A ferroelectric memory comprising:
   a ferroelectric thin film having first and second surfaces opposite to each other;
   a first electrode assembly including a plurality of stripe electrodes arranged in parallel on the first surface side of said ferroelectric thin film;
   a second electrode assembly including a plurality of stripe electrodes arranged in parallel on the second surface side of said ferroelectric thin film, said stripe electrodes of said second electrode assembly crossing over said stripe electrodes of said first electrode assembly;
   first and second common electrodes arranged separately from end portions of said respective first and second electrode assemblies and extending in respective directions in which said stripe electrodes of said first and second electrode assemblies are arranged; and
   selection means for respectively connecting said first and second electrode assemblies to said first and second common electrodes and for selectively activating at least one of said stripe electrodes of each of said first and second electrode assemblies.

2. A ferroelectric memory comprising:
   a ferroelectric thin film having first and second surfaces opposite to each other;
   a first electrode assembly including a plurality of stripe electrodes arranged in parallel on the first surface side of said ferroelectric thin film;
   a second electrode assembly including a plurality of stripe electrodes arranged in parallel on the second surface side of said ferroelectric thin film, said stripe electrodes of said second electrode assembly crossing over said stripe electrodes of said first electrode assembly;
   first and second common electrodes arranged separately from end portions of said respective first and second electrode assemblies and extending in respective directions in which said stripe electrodes of said first and second electrode assemblies are arranged; and
   photoconductive members formed between said first and second electrode assemblies and said first and second common electrodes and respectively electrically connecting them when said photoconductive members are illuminated with light.

3. A ferroelectric memory comprising:
   a ferroelectric thin film having first and second surfaces opposite to each other;
   a first electrode assembly including a plurality of stripe electrodes arranged in parallel on the first surface side of said ferroelectric thin film;
   a second electrode assembly including a plurality of stripe electrodes arranged in parallel on the second surface side of said ferroelectric thin film, said stripe electrodes of said second electrode assembly crossing over said stripe electrodes of said first electrode assembly;
   first and second common electrodes arranged separately from end portions of said respective first and second electrode assemblies and extending in respective directions in which said stripe electrodes of said first and second electrode assemblies are arranged; and
   semiconductor switching means for respectively connecting said first and second electrode assemblies to said first and second common electrodes and for selectively activating at least one of said stripe electrodes of each of said first and second electrode assemblies.

4. A ferroelectric memory according to claim 3, further comprising a drive cell layer formed on the side of said first and second electrode assemblies and including a plurality of drive cells arranged in one plane and having at least one semiconductor switch for each of said stripe electrodes of said first and second electrode assemblies, and wherein said drive cell layer is laminated together with said ferroelectric thin film and said first and second electrode assemblies to form a laminated structure.

5. A ferroelectric memory according to claim 4, wherein said drive cell layer includes a plurality of thin film transistors.

6. A ferroelectric memory according to claim 4, wherein the pitch of said stripe electrodes is set to be shorter than the length of one side of said drive cell, and wherein
   (i) each of said drive cells having substantially the same element construction pattern and arranged in the same plane is shifted by the pitch interval of aid stripe electrodes in a direction perpendicular to said stripe electrodes so that a contact portion which is formed is substantially the same position of each drive cell is connectable to a corresponding one of said stripe electrodes, or
   (ii) the contact portions formed in each of said drive cells is cell in a position shifted by the pitch of said stripe electrodes in a direction perpendicular to said stripe electrodes so as to be connectable to a corresponding one of said stripe electrodes.

7. A ferroelectric memory according to claim 3, further comprising:
   a first element including at least a drive cell layer and said first electrode assembly;
   a first substrate supporting said first element thereon;
   a second element including at least a drive cell, said second electrode assembly and the ferroelectric thin film; and
   a second substrate supporting the ferroelectric thin film of said second element thereon.

8. A ferroelectric memory according to claim 7, wherein at least of said drive cell layers is formed of vertical FETs.

9. A method for reading out data from a ferroelectric memory which comprises a ferroelectric thin film having first and second surfaces opposite to each other; a first electrode assembly including a plurality of stripe electrodes arranged in parallel on the first surface side of said ferroelectric thin film; a second electrode assembly including a plurality of stripe electrodes arranged in parallel on the second surface side of said ferroelectric thin film, said stripe electrodes of said first electrode assembly crossing over said stripe electrodes of said first electrode assembly; first and second common electrodes arranged separately from end portions of said respective first and second electrode assemblies and extending in respective directions in which said stripe electrodes in said first and second electrode assemblies are arranged; and first and second photoconductive members formed on and between end portions of said stripe electrodes of said first and second electrode assemblies and said first and second common electrodes;

the method comprising the steps of:
applying light beams to portions of said first and second photoconductive members corresponding to two selected stripe electrodes of said stripe electrodes of said first and second electrode assemblies to select a storing section of the ferroelectric thin film lying in a position which the two selected stripe electrodes intersect, said storing section comprising a memory; and
applying a voltage between the selected stripe electrodes to effect a data storing or readout operation with respect to the selected storing section.

10. A method for reading out data from a ferroelectric memory which comprises a ferroelectric thin film having first and second surfaces opposite to each other; a first electrode assembly including a plurality of stripe electrodes arranged in parallel on the first surface side of said ferroelectric thin film; a second electrode assembly including a plurality of stripe electrodes arranged in parallel on the second surface side of said ferroelectric thin film, said stripe electrodes of said first electrode assembly crossing over said stripe electrodes of said first electrodes assembly so that the ferroelectric thin film is divided into a plurality of memory cells disposed between the stripe electrodes of said first and second electrode assemblies; first and second common electrodes arranged separately from end portions of said respective first and second electrode assemblies and extending in respective directions in which said stripe electrodes of said first and second electrode assemblies are arranged; and first and second photoconductive members formed on and between end portions of said stripe electrodes of said first and second electrode assemblies and said first and second common electrodes;

the method comprising the steps of:
applying pressure to the entire portion of said ferroelectric thin film to generate a voltage in the memory cells by a piezoelectric effect; and
detecting the polarity of the voltage generated by application of the pressure to read out data stored in at least one of the memory cells.

11. A method for reading out data from a ferroelectric memory which comprises a ferroelectric thin film having first and second surfaces opposite to each other; a first electrode assembly including a plurality of stripe electrodes arranged in parallel on the first surface side of said ferroelectric thin film; a second electrode assembly including a plurality of stripe electrodes arranged in parallel on the second surface side of said ferroelectric thin film, said stripe electrodes of said first electrode assembly crossing over said stripe electrodes of said first electrode assembly so that the ferroelectric thin film is divided into a plurality of memory cells disposed between the strip electrodes of said first and second electrode assemblies; first and second common electrodes arranged separately from end portions of said respective first and second electrode assemblies and extending in respective directions in which said stripe electrodes of said first and second electrode assemblies are arranged; and photoconductive members formed on and between end portions of said stripe electrodes of said first and second electrode assemblies and said first and second common electrodes;

the method comprising the steps of:

heating the entire portions of said ferroelectric thin film to generate a pyroelectric current in the memory cells by a pyroelectric effect; and
detecting the polarity of the pyroelectric current generated by the heating operation to read out data stored in at least one of the memory cells.

12. A ferroelectric memory comprising;
a ferroelectric thin film having first and second surfaces opposite to each other;
a first electrode assembly including a plurality of stripe electrodes arranged in parallel on the first surface side of said ferroelectric thin film;
a second electrode assembly including a plurality of stripe electrodes arranged in parallel on the second surface side of said ferroelectric thin film, said stripe electrodes of said second electrode assembly crossing over said stripe electrodes of said first electrode assembly;
first and second common electrodes arranged separately from end portions of said respective first and second electrode assemblies and extending in respective directions in which said stripe electrodes of said first and second electrode assemblies are arranged; and
selection means for respectively connecting said first and second electrode assemblies to said first and second common electrodes and selectively activating at least one of said stripe electrodes of each of said first and second electrode assemblies;
said selection means including least two parallel selecting sections connected to each of said stripe electrodes of said first and second electrode assemblies, and control means for selectively controlling said selecting sections so as to ground nonselected ones of said stripe electrodes.

13. A ferroelectric memory according to claim 12, wherein one of said selecting sections is connected to a negative input terminal of an amplifier; and the other of said selecting sections is connected to an output terminal of said amplifier to thereby form a negative feedback circuit.

14. A ferromagnetic memory according to claim 12, wherein nonselected ones of said stripe electrodes are grounded in a data readout mode and are applied with a preset voltage lower than a write-in voltage in a data write-in mode.

15. A ferroelectric memory according to claim 1, further comprising a semiconductor portion having a nonlinear voltage-current characteristic and disposed between said ferroelectric thin film and at least one of said stripe electrodes of said first and second electrode assemblies.

16. A ferroelectric memory according to claim 15, wherein said semiconductor portion comprises a diode AC switch.

17. A ferroelectric memory according to claim 15, wherein said semiconductor portion comprises a silicon symmetrical switch.

18. A ferroelectric memory device comprising a plurality of laminated ferroelectric memories each comprising a ferroelectric memory according to claim 1.

19. A ferroelectric memory incorporated in a memory card which comprises a card body having therein a ferroelectric memory according to claim 1.

* * * * *

UNITED STATES PATENT AND TRADEMARK OFFICE
CERTIFICATE OF CORRECTION

PATENT NO. : 5,060,191
DATED : October 22, 1991
INVENTOR(S) : NAGASAKI et al

It is certified that error appears in the above-identified patent and that said Letters Patent is hereby corrected as shown below:

Title page, Section [56] References Cited, insert the following references, as indicated below:

U.S. PATENT DOCUMENTS -

4,707,897  11/1987  Rohrer et al......29/25.42
4,713,157  12/1987  McMillan et al....204/192.11

OTHER DOCUMENTS -

Mol Electron, pp.206-214 (1987), J.F. Scott et al, "The Physics of Ferroelectric Memories".

Mol Electron, pp.215-226 (1987), C.A. Paz de Araujo et al, "A Novel High Speed Nonvolatile Memory....Ferroelectric Thin Film".

IEEE JOURNAL OF SOLID-STATE CIRCUITS, Vol.23, No.5, October 1988, J.T. Evans et al, "An Experimental 512-bit Nonvolatile Memory with Ferroelectric Storage Cell".

Signed and Sealed this

Eighth Day of June, 1993

*Attest:*

MICHAEL K. KIRK

*Attesting Officer*    Acting Commissioner of Patents and Trademarks